United States Patent
Hautala et al.

(10) Patent No.: US 6,900,129 B2
(45) Date of Patent: *May 31, 2005

(54) CVD OF TANTALUM AND TANTALUM NITRIDE FILMS FROM TANTALUM HALIDE PRECURSORS

(75) Inventors: John J. Hautala, Beverly, MA (US); Johannes F. M. Westendorp, Rockport, MA (US)

(73) Assignee: Tokyo Electron Limited, Tokyo (JP)

( * ) Notice: Subject to any disclaimer, the term of this patent is extended or adjusted under 35 U.S.C. 154(b) by 978 days.

This patent is subject to a terminal disclaimer.

(21) Appl. No.: 09/911,913

(22) Filed: Jul. 24, 2001

(65) Prior Publication Data

US 2002/0013051 A1 Jan. 31, 2002

Related U.S. Application Data

(63) Continuation of application No. 09/300,658, filed on Apr. 27, 1999, now Pat. No. 6,265,311, and a continuation of application No. 09/300,661, filed on Apr. 27, 1999, now Pat. No. 6,410,433, and a continuation of application No. 09/300,583, filed on Apr. 27, 1999, now Pat. No. 6,413,860, and a continuation of application No. 09/300,632, filed on Apr. 27, 1999, now Pat. No. 6,410,432.

(51) Int. Cl.[7] .............................................. C23C 16/08
(52) U.S. Cl. ...................... 438/680; 438/685; 427/576; 427/124; 427/126.3; 427/253; 427/255.39; 427/255.394; 427/255.7
(58) Field of Search ................................. 427/576, 124, 427/126.3, 253, 255.39, 255.394, 255.7; 438/680, 685

(56) References Cited

U.S. PATENT DOCUMENTS

| | | | |
|---|---|---|---|
| 2,604,395 A | 7/1952 | Gonser et al. | |
| 3,767,456 A | 10/1973 | Glaski | 117/71 M |
| 4,535,000 A | 8/1985 | Gordon | 427/160 |
| 4,678,769 A | 7/1987 | King | 502/231 |
| 4,859,617 A | 8/1989 | Nomoto et al. | 437/40 |
| 4,882,224 A | 11/1989 | Moro et al. | 428/403 |
| 4,884,123 A | 11/1989 | Dixit et al. | 357/71 |
| 5,017,403 A | 5/1991 | Pang et al. | 427/39 |
| 5,173,327 A | 12/1992 | Sandhu et al. | 427/573 |

(Continued)

FOREIGN PATENT DOCUMENTS

| | | |
|---|---|---|
| EP | 0 077 535 | 4/1983 |
| EP | 0 875 924 | 11/1988 |
| JP | 010-74720 | 3/1989 |
| JP | 3-209869 | 9/1991 |
| WO | WO 96/12048 | 4/1996 |

OTHER PUBLICATIONS

H. Funakubo et al., *Preparation of TaNx–TiN Films by CVD*, J. Ceramic Soc. Jpn. Int. Ed. , vol. 98, pp. 173–178, Feb. 1990.

(Continued)

*Primary Examiner*—Timothy Meeks
(74) *Attorney, Agent, or Firm*—Wood, Herron & Evans, LLP

(57) ABSTRACT

A chemical vapor deposition (CVD) method for depositing high quality conformal tantalum (Ta) and tantalum nitride ($TaN_x$) films from inorganic tantalum pentahalide ($TaX_5$) precursors is described. The inorganic tantalum halide precursors are tantalum pentafluoride ($TaF_5$), tantalum pentachloride ($TaCl_5$) and tantalum pentabromide ($TaBr_5$). A $TaX_5$ vapor is delivered into a heated chamber. The vapor is combined with a process gas to deposit a Ta or $TaN_x$ film on a substrate that is heated to 300° C.–500° C. The deposited film is useful for integrated circuits containing copper films, especially in small high aspect ratio features. The high conformality of these films is superior to films deposited by PVD.

79 Claims, 16 Drawing Sheets

U.S. PATENT DOCUMENTS

| | | | |
|---|---|---|---|
| 5,177,589 A | 1/1993 | Kobayashi et al. | 257/773 |
| 5,271,963 A | 12/1993 | Eichman et al. | 427/248.1 |
| 5,326,404 A | 7/1994 | Sato | 118/723 |
| 5,380,678 A | 1/1995 | Yu et al. | 437/190 |
| 5,444,006 A | 8/1995 | Han et al. | 437/60 |
| 5,466,971 A | 11/1995 | Higuchi | 257/751 |
| 5,565,247 A | 10/1996 | Suzuki | 427/562 |
| 5,919,531 A | 7/1999 | Arkles et al. | 427/576 |
| 6,139,922 A | 10/2000 | Kaloyeros et al. | 427/576 |
| 6,143,657 A | 11/2000 | Liu et al. | 438/687 |
| 6,197,683 B1 | 3/2001 | Kang et al. | 438/643 |

OTHER PUBLICATIONS

X. Chen et al., *Low Temperature Plasma–Assisted Chemical Vapor Deposition of Tantalum Nitride from Tantalum Pentabromide for Copper Metallization,* J. Vac. Sci. Technol. B 17(1), pp. 182–185, Jan./Feb. 1999.

K. Hieber, *Structural and Electrical Properties of Ta and Ta Nitrides Deposited by Chemical Vapour Deposition,* Thin Solid Films, 24, pp. 157–164, 1974, no month available.

A. Kaloyeros et al., *Tantalum Nitride Films Grown by Inorganic Low Temperature Thermal Chemical Vapor Deposition,* Journal of the Electrochemical Society, 146(1), pp. 170–176, 1999, no month available.

X. Chen et al., *Low Temperature Plasma–Promoted Chemical Vapor Deposition of Tantalum from Tantalum Pentbromide for Copper Metallization,* J. Vac. Sci. Technol. B 16(5), pp. 2887–2890, Sep./Oct. 1998.

T. Takahashi et al., *Chemical Vapor Deposition of Tantalum Nitride Films,* Journal of Less–Common Metals, 52, pp. 29–36, 1977, no month available.

Vlakhov et al., *Superconducting Properties of CVD Tantalum Films,* Material Letters, vol. 6, No. 3, pp. 58–61, Dec. 1987.

Ugolini et al., *Photoelectron Spectroscopy Studies of Chemical Vapor Deposition of Ta from a $TaF_5$ Precursor on Si and $SiO_2$ Substrates,* J. Appl. Phys. 70(7), pp. 3899–3906, Oct. 1991.

Bunshah, *Deposition Technologies for Films and Coatings,* Noyes Publications, Park Ridge, NJ, USA, pp. 365–366, 1982, no month available.

CVD OF TANTALUM AND TANTALUM NITRIDE FILMS FROM TANTALUM HALIDE PRECURSORS

CROSS REFERENCE TO RELATED APPLICATION

This application is a continuation of U.S. patent application Ser. No. 09/300,658 filed Apr. 27, 1999 entitled "PECVD of TaN Films from Tantalum Halide Precursors" now U.S. Par. No. 6,265,311 and a continuation of U.S. patent application Ser. No. 09/300,661 filed Apr. 27, 1999 entitled "Thermal CVD of TaN Films from Tantalum Halide Precursors", now U.S. Pat. No. 6,410,433 and a continuation of U.S. patent application Ser. No. 09/300,583 filed Apr 27, 1999 entitled "PECVD of Ta Films from Tantalum Halide Precursors" now U.S. Pat. No. 6,413,860 and continuation of U.S. patent application Ser. No. 09/300,632 filed Apr. 27, 1999 entitled "CVD of Integrated Ta and $TaN_x$ Films from Tantalum Halide Precursors", now U.S. Pat. No. 6,440,432.

FIELD OF THE INVENTION

The invention relates to the formation of integrated circuits, and specifically to chemical vapor deposition of tantalum and tantalum nitride films from tantalum halide precursors.

BACKGROUND

Integrated circuits (IC) provide the pathways for signal transport in an electrical device. An IC in a device is composed of a number of active transistors contained in a silicon base layer of a semiconductor substrate. To increase the capacity of an IC, large numbers of interconnections with metal "wires" are made between one active transistor in the silicon base of the substrate and another active transistor in the silicon base of the substrate. The interconnections, collectively known as the metal interconnection of a circuit, are made through holes, vias or trenches that are cut into a substrate. The particular point of the metal interconnection which actually makes contact with the silicon base is known as the contact. The remainder of the hole, via or trench is filled with a conductive material, termed a contact plug. As transistor densities continue to increase, forming higher level integrated circuits, the diameter of the contact plug must decrease to allow for the increased number of interconnections, multilevel metallization structures and higher aspect ratio vias.

Aluminum has been the accepted standard for contacts and interconnections in integrated circuits. However, problems with its electromigration and its high electrical resistivity require new materials for newer structures with submicron dimensions. Copper holds promise as the interconnect material for the next generation of integrated circuits in ultra large scale integration (ULSI) circuitry, yet its formation of copper silicide (Cu—Si) compounds at low temperatures and its electromigration through a silicon oxide ($SiO_2$) are disadvantages to its use.

As the shift from aluminum to copper as an interconnect element of choice occurs, new materials are required to serve as a barrier, preventing copper diffusion into the underlying dielectric layers of the substrate. New materials are also required to serve as a liner, adhering subsequently deposited copper to the substrate. The liner must also provide a low electrical resistance interface between copper and the barrier material. Barrier layers that were previously used with aluminum, such as titanium (Ti) and titanium nitride (TiN) barrier layers deposited either by physical vapor deposition (PVD) methods such as sputtering and/or chemical vapor deposition (CVD), are ineffective as barriers to copper. In addition, Ti reacts with copper to form copper titanium compounds at the relatively low temperatures used with PVD and/or CVD.

Sputtered tantalum (Ta) and reactive sputtered tantalum nitride (TaN) have been demonstrated to be good diffusion barriers between copper and a silicon substrate due to their high conductivity, high thermal stability and resistance to diffusion of foreign atoms. However, the deposited Ta and/or TaN film has inherently poor step coverage due to its shadowing effects. Thus the sputtering process is limited to relatively large feature sizes (>0.3 $\mu$m) and small aspect ratio contact vias. CVD offers the inherent advantage over PVD of better conformality, even in small structures (<0.2 $\mu$m) with high aspect ratios. However, CVD of Ta and TaN with metal-organic sources such as tertbutylimidotris (diethylamido)tantalum TBTDET, pentakis (dimethylamino) tantalum (PDMAT) and pentakis (diethylamnio) tantalum (PDEAT) yields mixed results. Additional problems with Ta and TaN are that all resulting films have relatively high concentrations of oxygen and carbon impurities and require the use of a carrier gas.

The need to use a carrier gas presents the disadvantage that the concentration of the precursor gas in the carrier is not precisely known. As a result, accurate metering of a mixture of a carrier gas and a precursor gas to the CVD reaction chamber does not insure accurate metering of the precursor gas alone to the reactor. This can cause the reactants in the CVD chamber to be either too rich or too lean. The use of a carrier gas also presents the disadvantage that particulates are frequently picked up by the flowing carrier gas and delivered as contaminants to the CVD reaction chamber. Particulates on the surface of a semiconductor wafer during processing can result in the production of defective semiconductor devices.

Thus, a process to deposit TaN at the relatively low temperatures used in PECVD (<500° C.) would provide an advantage in the formation of copper barriers in the next generation of IC. Ideally, the deposited film will have a high step coverage (the ratio of the coating thickness at the bottom of a feature to the thickness on the sides of a feature or on the top surface of the substrate or wafer adjacent the feature), good diffusion barrier properties, minimal impurities, low resistivity, good conformality (even coverage of complex topography of high aspect ratio features) and ideally the process will have a high deposition rate.

SUMMARY OF THE INVENTION

The invention is directed to a method of depositing tantalum and tantalum nitride ($TaN_x$) films from a tantalum halide precursor on a substrate. The tantalum halide precursor is delivered at a temperature sufficient to vaporize the precursor to provide a vaporization pressure to deliver the tantalum vapor to a reaction chamber containing the substrate. The vaporization pressure is at least about 3 Torr. For tantalum deposition, the vapor is combined with a process gas and tantalum is deposited on the substrate by a PECVD process. For tantalum nitride deposition, the vapor is combined with a process gas containing nitrogen and $TaN_x$ is deposited on the substrate by either a thermal CVD process or a PECVD process. The tantalum halide precursor is tantalum fluoride (TaF), tantalum chloride (TaCl) or tantalum bromide (TaBr), preferably tantalum pentafluoride ($TaF_5$), tantalum pentachloride ($TaCl_5$) or tantalum pentabromide (TaBr$_5$). The substrate temperature is in the range of about 300° C.–500° C.

The invention is also directed to a method of depositing a Ta and/or TaN$_x$ film from a TaF$_5$ or TaCl$_5$ precursor on a substrate by elevating the precursor temperature sufficient to vaporize the precursor. The vapor is combined with a process gas, containing nitrogen in the case of TaN$_x$ deposition, and the film is deposited by CVD.

The invention is further directed to method of depositing a Ta and/or TaN$_x$ film from a TaF$_5$ precursor on a substrate without a carrier gas. The temperature of the precursor is elevated sufficient to produce a tantalum vapor. The vapor is combined with a process gas, containing nitrogen in the case of TaN$_x$ deposition, and the film is deposited on the substrate by CVD.

The invention is still further directed to a substrate integral with a copper layer and a Ta and/or TaN$_x$ layer in which diffusion of copper is prevented by the Ta and/or TaN$_x$ layer.

The Ta and/or TaN$_x$ layer deposited according to the invention has minimal impurities and low resistivity. The film provides good step coverage, good conformality in high aspect ratio features and is a good diffusion barrier to a copper film.

It will be appreciated that the disclosed method and substrates of the invention have an array of applications. These and other advantages will be further understood with reference to the following drawings and detailed description.

DETAILED DESCRIPTION

Refractory transition metals such as tantalum (Ta) and their nitride films (TaN) are effective diffusion barriers to copper (Cu). Their effectiveness is due to their high thermal stability, high conductivity and resistance to diffusion of foreign elements or impurities. Ta and TaN are especially attractive due to their chemical inertness with Cu; no compounds form between Cu and Ta or Cu and N.

Tantalum halides provide a convenient inorganic source for Ta and TaN. Specifically, the inorganic precursor is a tantalum pentahalide (TaX$_5$) where X represents the halides fluorine (F), chlorine (Cl) and bromine (Br). Table 1 shows relevant thermodynamic properties of the tantalum halide precursors, specifically tantalum pentafluoride (TaF$_5$), tantalum pentachloride (TaCl$_5$) and tantalum bromide (TaBr$_5$), with tantalum pentaiodide (TaI$_5$) included for comparison. The TaF$_5$, TaCl$_5$ and TaBr$_5$ precursor materials are all solids at room temperature (18° C.–22° C.).

TABLE 1

| PRECURSOR | MELTING POINT | BOILING POINT | CHANGE IN HEAT OF FORMATION (ΔHf) |
|---|---|---|---|
| TaF$_5$ | 97° C. | 230° C. | −455 kcal/mole |
| TaCl$_5$ | 216° C. | 242° C. | −205 kcal/mole |
| TaBr$_5$ | 265° C. | 349° C. | −143 kcal/mole |
| TaI$_5$ | 367° C. | 397° C. | −82 kcal/mole |

Figure 1:
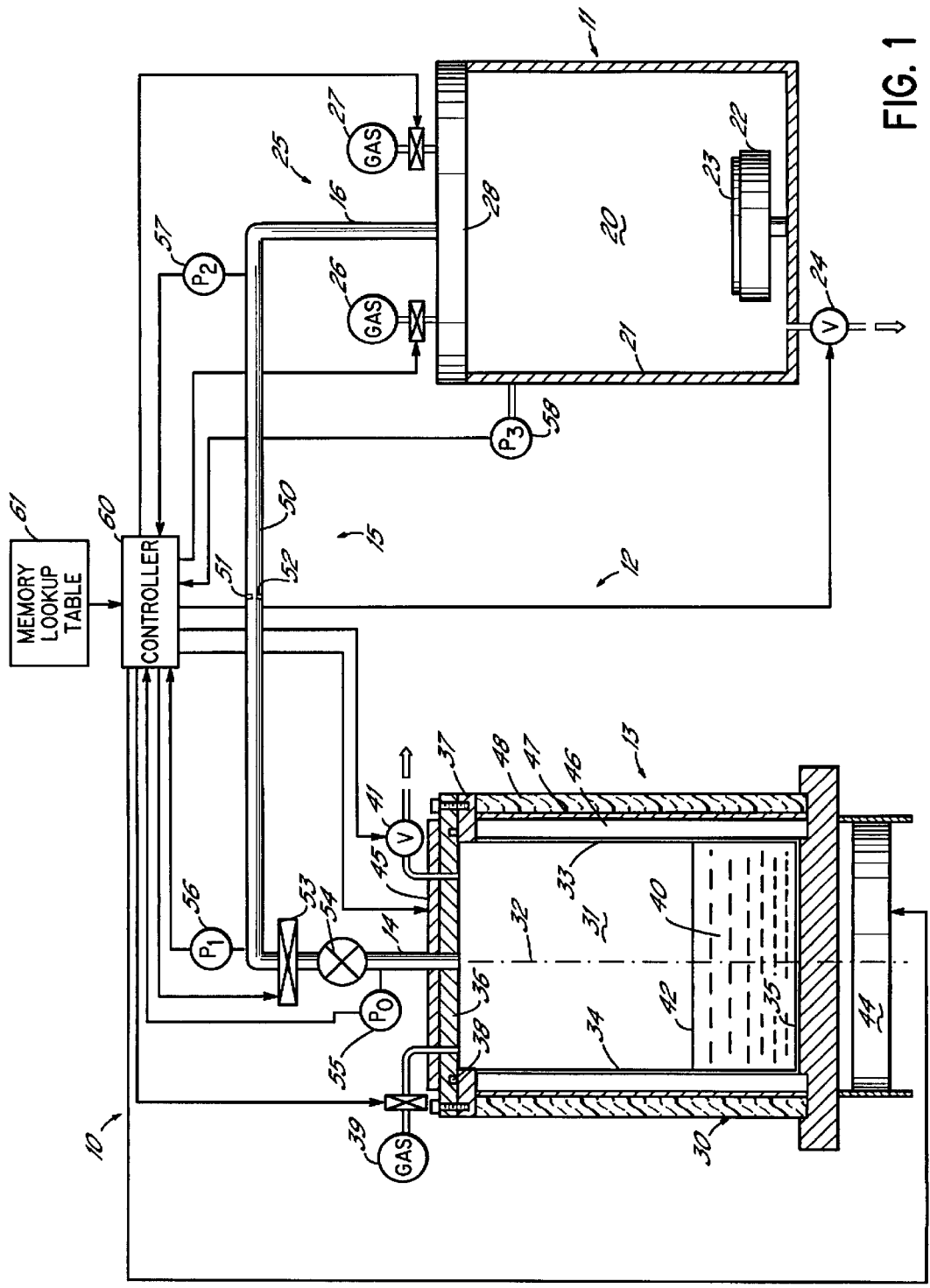
FIG. 1 is a schematic of an apparatus for thermal and plasma enhanced chemical vapor deposition.

In chemical vapor deposition (CVD) processes, gas precursors are activated using either thermal energy or electrical energy. Upon activation, the gas precursors react chemically to form a film. A preferred method of CVD is illustrated in FIG. 1 and is disclosed in copending application Ser. No. 09/300,669 entitled APPARATUS AND METHODS FOR DELIVERY OF VAPOR FROM SOLID SOURCES TO A CVD CHAMBER by Westendorp et al., which is incorporated by reference herein in its entirety. A chemical vapor deposition (CVD) system 10 includes a CVD reactor 11 and a precursor delivery system 12. In the reactor 11, a reaction is carried out to convert a precursor gas of, for example, tantalum chloride (TaCl) or other tantalum halide compound, into a film such as a barrier layer film of tantalum (Ta) or tantalum nitride (TaN$_x$). The TaN film is not limited to any particular stoichiometry (TaN$_x$), since TaN$_x$ can be continuously varied by changing the ratios of the gases in any given deposition. Thus, as used herein, TaN$_x$ encompasses a tantalum nitride film of any stoichiometry.

The precursor delivery system 12 includes a source 13 of precursor gas having a gas outlet 14, which communicates through a metering system 15 with a gas inlet 16 to the CVD reaction chamber 11. The source 13 generates a precursor gas, for example a tantalum halide vapor, from a tantalum halide compound. The compound is one that is in a solid state when at standard temperature and pressure. The precursor source is maintained, preferably by controlled heating, at a temperature that will produce a desired vapor pressure of precursor. Preferably, the vapor pressure is one that is itself sufficient to deliver the precursor vapor to the reaction chamber 11, preferably without the use of a carrier gas. The metering system 15 maintains a flow of the precursor gas vapor from the source 13 into the reaction chamber 11 at a rate that is sufficient to maintain a commercially viable CVD process in the reaction chamber 11.

The reaction chamber 11 is a generally conventional CVD reaction chamber and includes a vacuum chamber 20 that is bounded by a vacuum tight chamber wall 21. In the chamber 20 is situated a substrate support or susceptor 22 on which a substrate such as a semiconductor wafer 23 is supported. The chamber 20 is maintained at a vacuum appropriate for the performance of a CVD reaction that will deposit a film such as a Ta/TaN$_x$ barrier layer on the semiconductor wafer substrate 23. A preferred pressure range for the CVD reaction chamber 11 is in the range of from 0.2–5.0 Torr. The vacuum is maintained by controlled operation of a vacuum pump 24 and of inlet gas sources 25 that include the delivery system 12 and may also include reducing gas sources 26 of, for example, hydrogen (H$_2$), nitrogen (N$_2$) or ammonia (NH$_3$) for use in carrying out a tantalum reduction reaction, and an inert gas source 27 for a gas such as argon (Ar) or helium (He). The gases from the sources 25 enter the chamber 20 through a showerhead 28 that is situated at one end of the chamber 20 opposite the substrate 23, generally parallel to and facing the substrate 23.

The precursor gas source 13 includes a sealed evaporator 30 that includes a cylindrical evaporation chamber 31 having a vertically oriented axis 32. The chamber 31 is bounded by a cylindrical wall 33 formed of a high temperature tolerant and non-corrosive material such as the alloy INCONEL 600, the inside surface 34 of which is highly polished and smooth. The wall 33 has a flat circular closed bottom 35 and an open top, which is sealed by a cover 36 of the same heat tolerant and non-corrosive material as the wall 33. The outlet 14 of the source 13 is situated in the cover 36. When high temperatures are used, such as with TiI$_4$ or TaBr$_5$, the cover 36 is sealed to a flange ring 37 that is integral to the top of the wall 33 by a high temperature tolerant vacuum compatible metal seal 38 such as a HELICOFLEX seal, which is formed of a C-shaped nickel tube surrounding an INCONEL coil spring. With TaCl$_5$ and TaF$_5$, a conventional elastomeric O-ring seal 38 may be used to seal the cover.

Connected to the vessel 31 through the cover 36 is a source 39 of a carrier gas, which is preferably an inert gas such as He or Ar. The source 13 includes a mass of precursor material such as tantalum fluoride, chloride or bromide (TaX), preferably as the pentahalide (TaX$_5$), at the bottom of the vessel 31, which is loaded into the vessel 31 at standard temperature and pressure in a solid state. The vessel 31 is filled with tantalum halide vapor by sealing the vessel with the solid mass of TaX therein. The halide is supplied as a precursor mass 40 that is placed at the bottom of the vessel 31, where it is heated, preferably to a liquid state as long as the resulting vapor pressure is in an acceptable range. Where the mass 40 is liquid, the vapor lies above the level of the liquid mass 40. Because wall 33 is a vertical cylinder, the surface area of TaX mass 40, if a liquid, remains constant regardless of the level of depletion of the TaX.

The delivery system 12 is not limited to direct delivery of a precursor 40 but can be used in the alternative for delivery of precursor 40 along with a carrier gas, which can be introduced into the vessel 31 from gas source 39. Such a gas may be hydrogen (H$_2$) or an inert gas such as helium (He) or argon (Ar). Where a carrier gas is used, it may be introduced into the vessel 31 so as to distribute across the top surface of the precursor mass 40 or may be introduced into the vessel 31 so as to percolate through the mass 40 from the bottom 35 of the vessel 31 with upward diffusion in order to achieve maximum surface area exposure of the mass 40 to the carrier gas. Yet another alternative is to vaporize a liquid that is in the vessel 31. However, such alternatives add undesired particulates and do not provide the controlled delivery rate achieved by the direct delivery of the precursor, that is, delivery without the use of a carrier gas. Therefore, direct delivery of the precursor is preferred.

Figure 2:
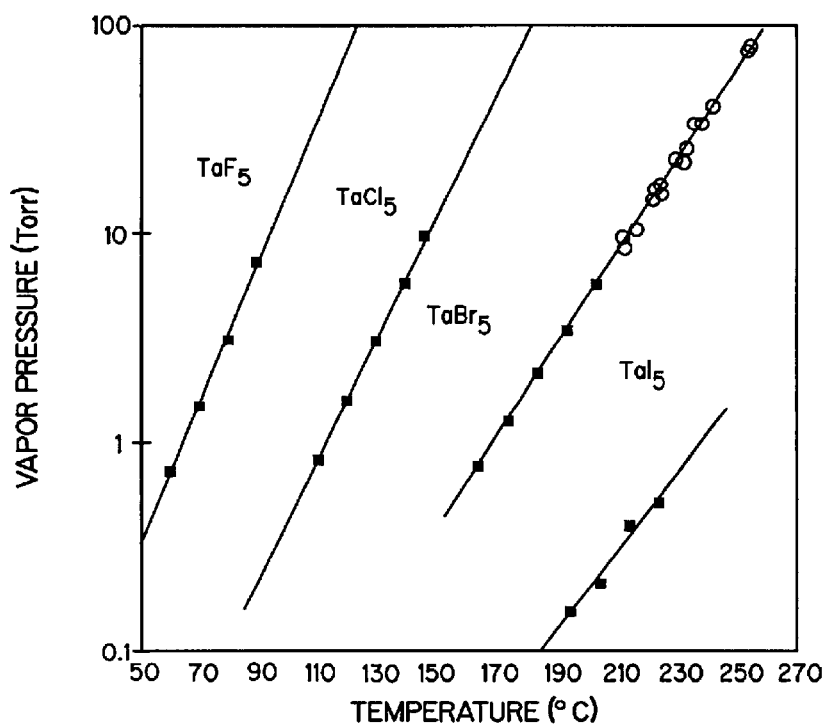
FIG. 2 is a graph of vapor pressure versus temperature for tantalum halides.

To maintain the temperature of the precursor 40 in the vessel 31, the bottom 35 of the wall 33 is maintained in thermal communication with a heater 44, which maintains the precursor 40 at a controlled temperature, preferably above its melting point, that will produce a vapor pressure in the range of about 3 Torr in the absence of a carrier gas (i.e., a direct delivery system), and a lower vapor pressure such as about 1 Torr when a carrier gas is used. The exact vapor pressure depends upon other variables such as the quantity of carrier gas, the surface area of the substrate 23, and so on. In a direct delivery system for tantalum, a vapor pressure can be maintained at the preferred pressure of 5 Torr or above by heating the a tantalum halide precursor in the 95° C. to 205° C. range as shown in FIG. 2. For TaX$_5$ the desired temperature is at least about 95° C. for TaF$_5$, the desired temperature is at least about 145° C. for TaCl$_5$, and the desired temperature is at least about 205° C. for TaBr$_5$. The melting points of the respective fluoride, chloride and bromide tantalum pentahalide compounds are in the 97° C. to 265° C. range. A much higher temperature is required for tantalum pentaiodide (TaI$_5$) to produce a sufficient vapor pressure in the vessel 31. Temperatures should not be so high as to cause premature reaction of the gases in the showerhead 28 or otherwise before contacting the wafer 23.

For purposes of example, a temperature of 180° C. is assumed to be the control temperature for the heating of the bottom 35 of the vessel 31. This temperature is appropriate for producing a desired vapor pressure with a titanium tetraiodide (TiI$_4$) precursor. Given this temperature at the bottom 35 of the vessel 31, to prevent condensation of the precursor vapor on the walls 33 and cover 36 of the vessel 31, the cover is maintained at a higher temperature than the heater 44 at the bottom 35 of the wall 33 of, for example, 190° C., by a separately controlled heater 45 that is in thermal contact with the outside of the cover 36. The sides of the chamber wall 33 are surrounded by an annular trapped air space 46, which is contained between the chamber wall 33 and a surrounding concentric outer aluminum wall or can 47. The can 47 is further surrounded by an annular layer of silicon foam insulation 48. This temperature maintaining arrangement maintains the vapor in a volume of the vessel 31 bounded by the cover 36, the sides of the walls 33 and the surface 42 of the precursor mass 40 in the desired example temperature range of between 180° C. and 190° C. and the pressure greater than about 3 Torr, preferably at greater than 5 Torr. The temperature that is appropriate to maintain the desired pressure will vary with the precursor material, which is primarily contemplated as a being a tantalum or titanium halide compound.

The vapor flow metering system 15 includes a delivery tube 50 of at least ½ inch in diameter, or at least 10 millimeters inside diameter, and preferably larger so as to provide no appreciable pressure drop at the flow rate desired, which is at least approximately 2 to 40 standard cubic centimeters per minute (sccm). The tube 50 extends from the precursor gas source 13 to which it connects at its upstream end to the outlet 14, to the reaction chamber 11 to which it connects at its downstream end to the inlet 16. The entire length of the tube 50 from the evaporator outlet 14 to the reactor inlet 16 and the showerhead 28 of the reactor chamber 20 are also preferably heated to above the evaporation temperature of the precursor material 40, for example, to 195° C.

In the tube 50 is provided baffle plate 51 in which is centered a circular orifice 52, which preferably has a diameter of approximately 0.089 inches. The pressure drop from gauge 156 to gauge 257 is regulated by control valve 53. This pressure drop after control valve 53 through orifice 52 and into reaction chamber 11 is greater than about 10 milliTorr and will be proportional to the flow rate. A shut-off valve 54 is provided in the line 50 between the outlet 14 of the evaporator 13 and the control valve 53 to close the vessel 31 of the evaporator 13.

Pressure sensors 55–58 are provided in the system 10 to provide information to a controller 60 for use in controlling the system 10, including controlling the flow rate of precursor gas from the delivery system 15 into the chamber 20 of the CVD reaction chamber 11. The pressure sensors include sensor 55 connected to the tube 50 between the outlet 14 of the evaporator 13 and the shut-off valve 54 to monitor the pressure in the evaporation vessel 31. A pressure sensor 56 is connected to the tube 50 between the control valve 53 and the baffle 51 to monitor the pressure upstream of the orifice 52, while a pressure sensor 57 is connected to the tube 50 between the baffle 51 and the reactor inlet 16 to monitor the pressure downstream of the orifice 52. A further pressure sensor 58 is connected to the chamber 20 of the reaction chamber 11 to monitor the pressure in the CVD chamber 20.

Control of the flow of precursor vapor into the CVD chamber 20 of the reaction chamber 11 is achieved by the controller 60 in response to the pressures sensed by the sensors 55–58, particularly the sensors 56 and 57 which determine the pressure drop across the orifice 52. When the conditions are such that the flow of precursor vapor through the orifice 52 is unchoked flow, the actual flow of precursor vapor through the tube 52 is a function of the pressures monitored by pressure sensors 56 and 57, and can be determined from the ratio of the pressure measured by sensor 56 on the upstream side of the orifice 52, to the pressure measured by sensor 57 on the downstream side of the orifice 52.

When the conditions are such that the flow of precursor vapor through the orifice 52 is choked flow, the actual flow of precursor vapor through the tube 52 is a function of only the pressure monitored by pressure sensor 57. In either case, the existence of choked or unchoked flow can be determined by the controller 60 by interpreting the process conditions. When the determination is made by the controller 60, the flow rate of precursor gas can be determined by the controller 60 through calculation.

Preferably, accurate determination of the actual flow rate of precursor gas is calculated by retrieving flow rate data from lookup or multiplier tables stored in a non-volatile memory 61 accessible by the controller 60. When the actual flow rate of the precursor vapor is determined, the desired flow rate can be maintained by a closed loop feedback control of one or more of the variable orifice control valve 53, the CVD chamber pressure through evacuation pump 24 or control of reducing or inert gases from sources 26 and 27, or by control of the temperature and vapor pressure of the precursor gas in chamber 31 by control of heaters 44, 45.

As shown in FIG. 1, the solid $TaF_5$, $TaCl_5$ and $TaBr_5$ precursor material 40 is sealed in a cylindrical corrosion resistant metal vessel 31 that maximizes the available surface area of the precursor material. Vapor from either $TaF_5$, $TaCl_5$ or $TaBr_5$ was delivered directly, that is, without the use of a carrier gas, by a high conductance delivery system into a chamber 11. The chamber 11 was heated to a temperature of at least about 100° C. to prevent condensation of vapor or deposition by-products.

The controlled direct delivery of tantalum halide vapor into the reaction chamber 11 was accomplished by heating the solid tantalum halide precursor 40 to a temperature in the range of about 95° C.–205° C., the choice depending upon the particular precursor. The temperature was sufficient to vaporize the precursor 40 to provide a vapor pressure to deliver the tantalum halide vapor to the chamber 11. Thus, a carrier gas was not necessary and preferably was not used. A sufficient vapor pressure was greater than about 3 Torr, for example about 3–10 Torr. This pressure was required to maintain a constant pressure drop across a defined orifice in a high conductance delivery system while delivering up to about 50 sccm tantalum halide precursor to a reaction chamber 11 operating in the range of about 0.1–2.0 Torr. The temperatures to obtain the desired pressures in a direct delivery system were in the range of about 83° C.–95° C. and preferably about 95° C. with $TaF_5$, in the range of about 130° C.–150° C. and preferably about 145° C. with $TaCl_5$, and in the range of about 202° C.–218° C. and preferably about 205° C. with $TaBr_5$. Under these conditions, $TaF_5$ is a liquid while $TaCl_5$ and $TaBr_5$ remain solid.

FIG. 2 shows the relationship between the measured vapor pressure and temperature for the precursors $TaF_5$, $TaCl_5$ and $TaBr_5$, with $TaI_5$ included for comparison. As previously stated, the desired pressure was greater than about 3 Torr and preferably greater than 5 Torr. Also as previously stated, the vapor pressure for $TaF_5$, $TaCl_5$ and $TaBr_5$ was desirably low enough to be able to deposit tantalum in the absence of a carrier gas but yet sufficient to maintain a constant pressure drop across a defined orifice in a high conductance delivery system and still be able to deliver up to 50 sccm $TaX_5$ to a reaction chamber 11 operating at 0.1–2.0 Torr. The vapor pressure for $TaI_5$ was determined to be too low for practical implementation in the described apparatus. For $TaBr_5$ the open circles represent published values, while closed squares for $TaBr_5$, $TaF_5$, $TaCl_5$ and $TaI_5$ represent the inventors' experimental data.

In the case of PECVD of Ta, a parallel plate RF discharge was used where the driven electrode was the gas delivery showerhead and the susceptor 22 or stage for the wafer or substrate 23 was the RF ground. The selected $TaX_5$ vapor was combined with other process gases such as $H_2$ above the substrate, which had been heated to a temperature between about 300° C.–500° C. Ar and He could also be used, either singularly or in combination, as process gases in addition to $H_2$.

Process conditions for deposition of good quality PECVD Ta films are given in Table 2, where slm is standard liters per minute and W/cm² is watts per centimeter squared.

TABLE 2

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $H_2$ flow | 1–10 slm |
| Ar, He flow | 0–10 slm |
| Process Pressure | 0.2–5.0 Torr |
| RF Power | 0.1–5.0 W/cm² |

The $TaF_5$, $TaCl_5$ and $TaBr_5$ based PECVD Ta film properties for process conditions using the method of the invention are given in Table 3. Representative values were selected from among the depositions of Ta from a $TaX_5$ precursor ($TaF_5$ n=15, $TaCl_5$ n=8, $TaBr_5$ n=8) on 200 mm Si and $SiO_2$ substrates. In addition, $Ta/TaN_x$ bilayers were also deposited ($TaF_5$ n=3, $TaCl_5$ n=1, $TaBr_5$ n=1). The properties of the deposited Ta films as listed in Table 3 were uniform within plus or minus 20% across the wafer.

Figure 3:
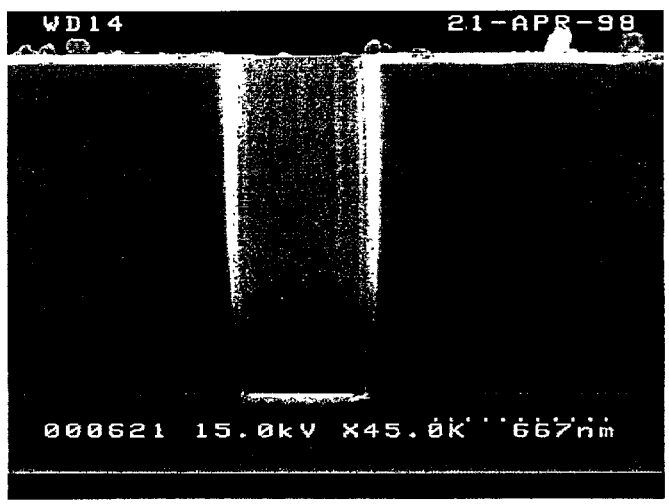
FIG. 3 is a photograph of a scanning electron micrograph (SEM) of a PECVD tantalum (Ta) film deposited using a tantalum pentafluoride (TaF$_5$) precursor.
Figure 4:
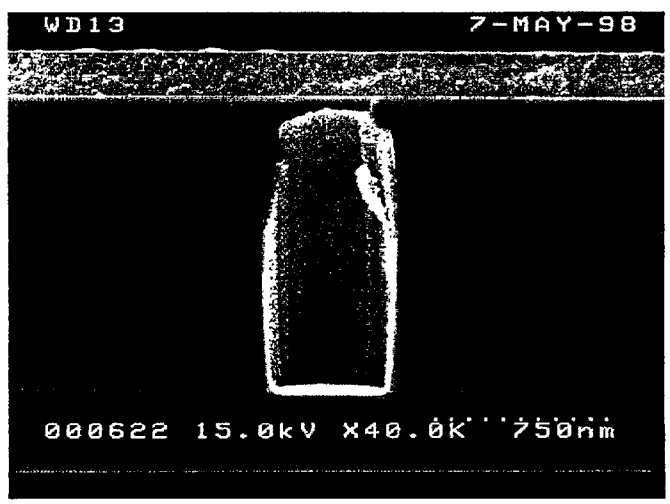
FIG. 4 is a photograph of a SEM of a PECVD Ta film deposited using a tantalum pentachloride (TaCl$_5$) precursor.
Figure 5:
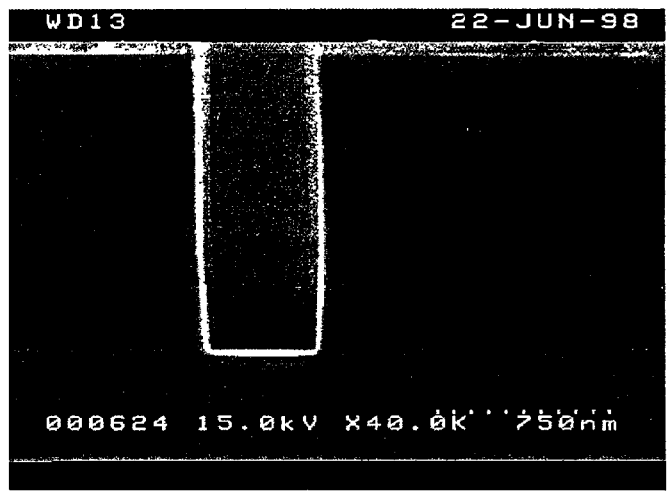
FIG. 5 is a photograph of a SEM of a PECVD Ta film deposited using a tantalum pentabromide (TaBr$_5$) precursor.

Scanning electron micrographs (SEM) of Ta films deposited by PECVD according to the invention were obtained and are reproduced in FIGS. 3–5. FIG. 3 is a SEM of a PECVD Ta film using $TaF_5$ as the precursor, FIG. 4 is a SEM of a PECVD Ta film using $TaCl_5$ as the precursor and FIG. 5 is a SEM of a PECVD Ta film using $TaBr_5$ as the precursor.

Each of the figures shows a 3:1 aspect ratio structure with representative bottom step coverage and side wall coverage for each of the three precursors. The step coverage represents the film thickness on the bottom of the feature divided by the film thickness on the surface of the substrate adjacent the feature, also called the field. An ideal step coverage is 1.0 or 100%, representing an identical thickness on the bottom as on the field. As shown in Table 3, for $TaBr_5$ the step coverage was 0.50 and 0.58, for $TaCl_5$ the step coverage was 0.24 and for $TaF_5$ the step coverage was 0.4 and 0.5.

As shown in FIGS. 3–5, the PECVD Ta films generally appeared to have good dense morphologies. The Ta films using $TaBr_5$ and $TaCl_5$ as the precursors generally appeared to be smoother and Ta films using $TaF_5$ as the precursor generally appeared rougher.

The compatibility of the Ta film process of the present invention with copper was determined. Since in practice the Ta film will be integral, that is, in direct contact with copper, little or no attack or etching of the copper should take place during Ta deposition. Ta compatibility with copper was tested by placing a Si wafer containing a 500 Å layer of

TABLE 3

| Film | Precursor | $TaX_5$ flow (sccm) | $H_2$ flow (slm) | Pressure (Torr) | Temp. (° C.) | RF (Watts) | Dep. rate (Å/min) | Resistivity ($\mu\Omega$cm) | Step Coverage | Halogen conc (atomic %) |
|---|---|---|---|---|---|---|---|---|---|---|
| Ta | $TaF_5$ | 14 | 7 | 1 | 375 | 200 | 150 | 49 | 0.4 | <2 |
| Ta | $TaF_5$ | 14 | 7 | 1 | 440 | 100 | 125 | 530 | 0.5 | <2 |
| Ta | $TaCl_5$ | 14 | 7 | 1 | 350 | 200 | 400 | 560 | 0.24 | <2 |
| Ta | $TaCl_5$ | 14 | 7 | 1 | 400 | 200 | 220 | 220 | not determined | <2 |
| Ta | $TaBr_5$ | 5 | 7 | 1 | 375 | 100 | 100 | 600 | 0.50 | <2 |
| Ta | $TaBr_5$ | 5 | 7 | 1 | 430 | 100 | 115 | 464 | 0.58 | <2 |

The film deposited by the method of the invention displayed characteristics important to the formation of an IC. The film is in the range of low enough electrical resistivity for low interconnect impedances (less than 1000 $\mu\Omega$cm and preferably less than 500 $\mu\Omega$cm), and the film has good conformality and good step coverage (greater than 0.3). In addition, the level of impurities are low (less than 2 atomic percent). Also, the deposition rates are sufficient for throughput considerations (greater than 100 Å/min) and the process uses a low wafer temperature (less than 450° C.) and thus is compatible with other thin film materials used within the device, including electric materials with dielectric constants lower than that of $SiO_2$.

The dependence of film resistivities on the deposition temperature differed among the three precursors. Resistivity for PECVD Ta films deposited using $TaBr_5$ as the precursor increased from 464 $\mu\Omega$cm to 600 $\mu\Omega$cm as the temperature of the substrate decreased from 430° C. to 375° C. Resistivity for PECVD Ta films deposited using $TaCl_5$ as the precursor increased from 220 $\mu\Omega$cm to 560 $\mu\Omega$cm as the temperature decreased from 400° C. to 350° C., a more dramatic change in resistivity than with $TaBr_5$. When PECVD Ta films were deposited using $TaF_5$ as the precursor the resistivity actually decreased from 530 $\mu\Omega$cm to 49 $\mu\Omega$cm as the deposition temperature decreased from 440° C. to 375° C. This was significantly lower than the resistivity reported for Ta films deposited by PVD. Thus, the lowest electrical resistivity in a deposited PECVD Ta film was obtained when $TaF_5$ was used as the precursor at a temperature of 375° C.

titanium nitride (TiN) deposited by PVD and a 2000 Å layer of copper deposited by PVD into the reaction chamber 11. A Ta film was deposited by PECVD on top of the copper layer using the process of the invention with either a $TaF_5$, $TaCl_5$ or $TaBr_5$ precursor.

Figure 6:
FIG. 6 is a photograph of a SEM of a TaF$_5$ based film stack.
Figure 7:
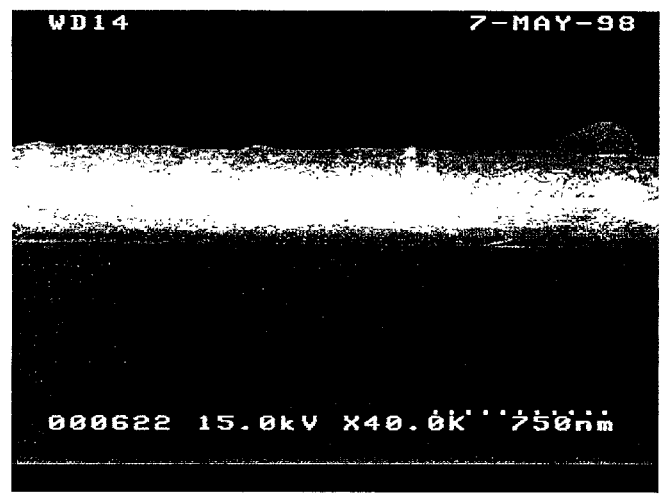
FIG. 7 is a photograph of a SEM of a TaCl$_5$ based film stack.
Figure 8:
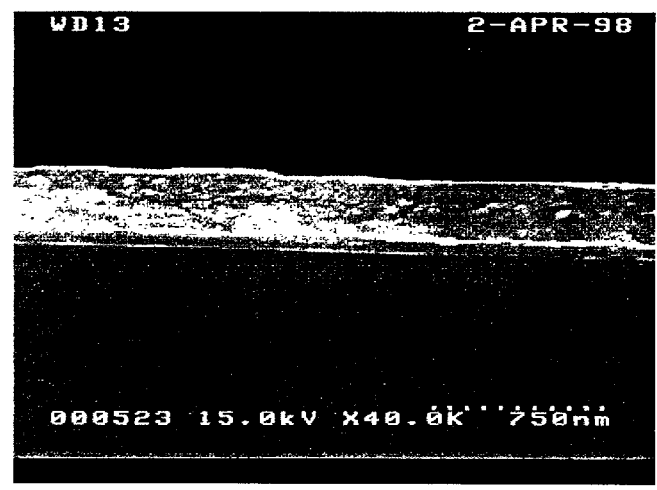
FIG. 8 is a photograph of a SEM of a TaBr$_5$ based film stack.

Photographs of SEM of the resulting films are shown in FIGS. 6–8. FIG. 6 shows a $TaF_5$ based PECVD Ta film in a stack having layers of $SiO_2$/TiN/Cu/Ta with an overlying layer of TaN. FIG. 7 shows a $TaCl_5$ based PECVD Ta film in a stack having layers of $SiO_2$/TiN/Cu/Ta with an overlying layer of TaN. FIG. 8 shows a $TaBr_5$ based Ta film in a stack having layers of $SiO_2$/TiN/Cu/Ta with an overlayer of $TaN_x$. The Cu layers have the same thicknesses of about 2000 Å as deposited. It can therefore be concluded that very little or no attack or etching occurs during PECVD of either $TaF_5$, $TaCl_5$ or $TaBr_5$ precursor-based Ta films.

Figure 9:
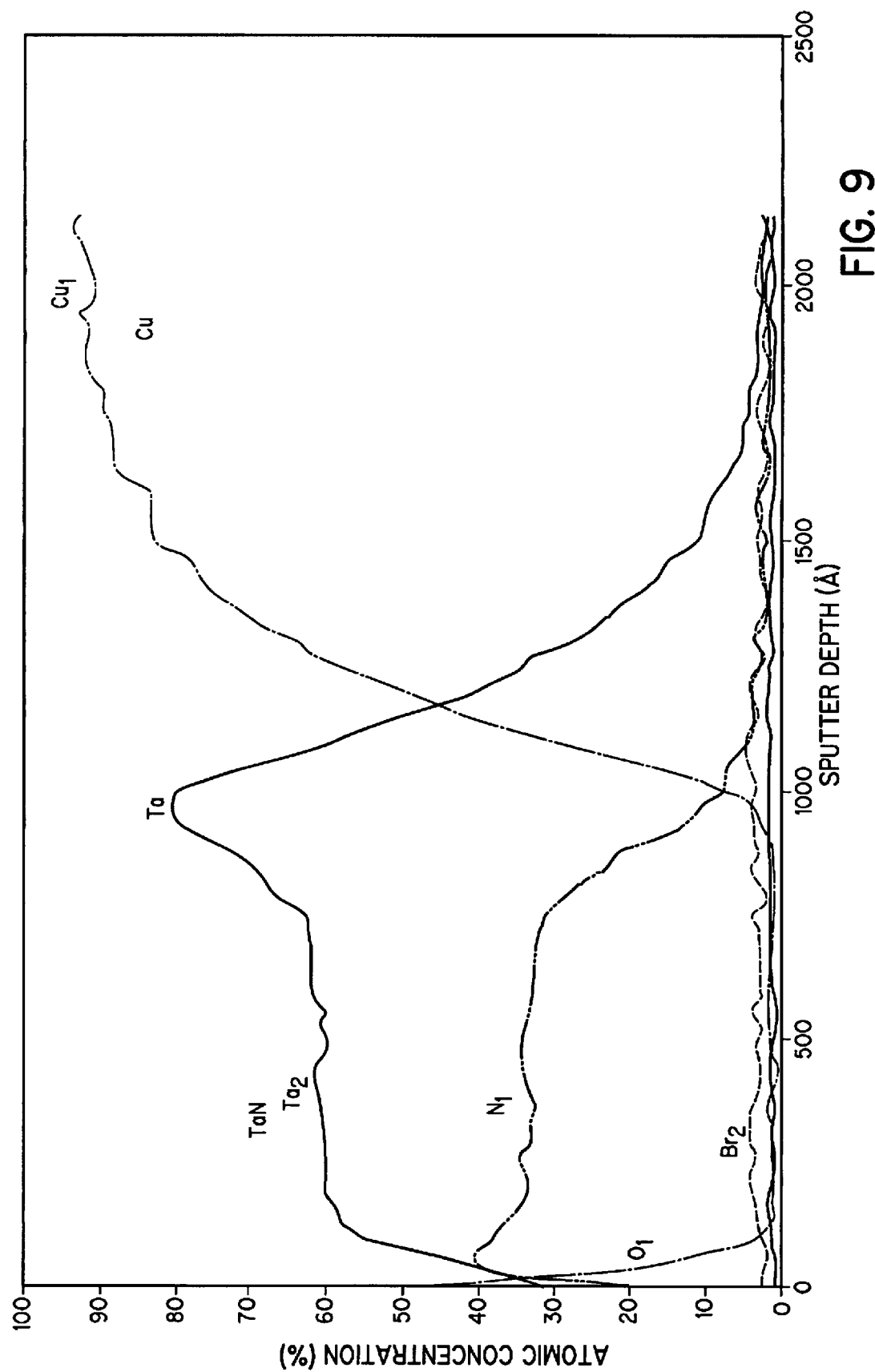
FIG. 9 is an Auger spectrum tracing of a PECVD Ta film using a TaBr$_5$ precursor deposited on a Cu layer.
Figure 10:
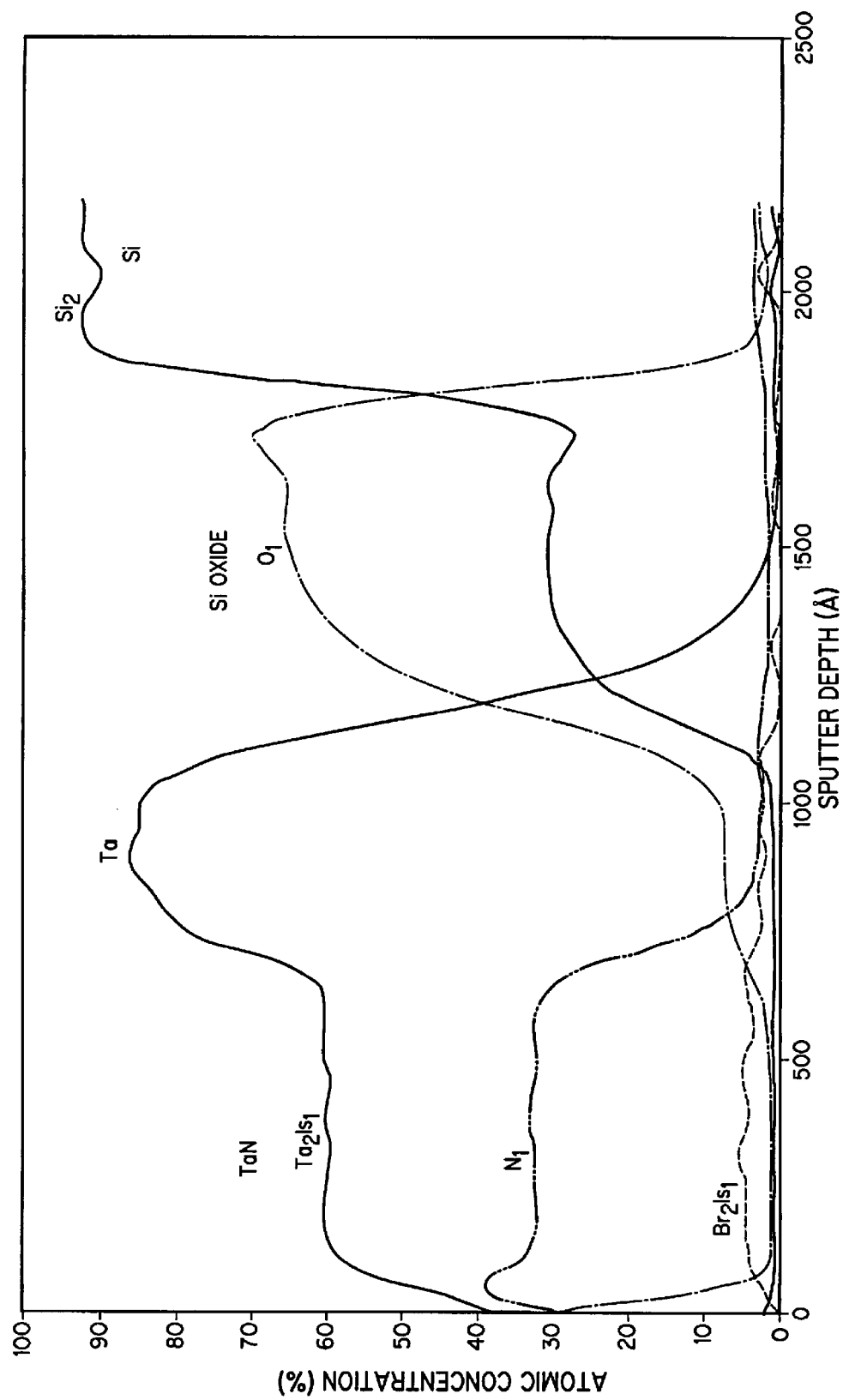
FIG. 10 is an Auger spectrum tracing of a PECVD Ta film using a TaBr$_5$ precursor deposited on silicon dioxide.

Selected films were also evaluated by Auger electron spectroscopy. Analysis of the Auger spectra confirmed the clean interface and the minimal diffusion between the copper and PECVD tantalum layers. The analysis also confirmed the low level of impurities present in the films. Auger analysis spectra are shown in FIGS. 9–10 with $TaBr_5$ used as the precursor for depositing PECVD Ta on either a Cu layer deposited by PVD (FIG. 9) or directly on $SiO_2$ in a $SiO_2$/Si bilayer (FIG. 10). The samples also had a $TaBr_5$ based PECVD layer of TaN on top of the tantalum. FIGS. 9–10 show relatively sharp interfaces between all layers including with copper. The bromide concentration was determined to be less than 2 atomic percent as in previous experiments.

Therefore, a method of producing high quality PECVD Ta films suitable for integration with IC interconnect elements that contain Cu has been demonstrated. The method is based on the direct vapor delivery of either $TaF_5$, $TaCl_5$ or $TaBr_5$ precursors. All of the resulting Ta films from the three precursors demonstrated reasonable step coverage, low residual impurity concentrations, sufficiently high deposition rates and no signs of Ta etching of Cu. Of the three precursors analyzed, $TaF_5$ based films initially appeared the most promising due to the significantly lower electrical resistivities that were obtained at relatively low deposition temperatures of around less than 400° C. in comparison to $TaCl_5$ and $TaBr_5$ based films.

In the case of PECVD of TaN, a parallel plate RF discharge was used where the driven electrode was the gas delivery showerhead and the susceptor 22 or stage for the wafer or substrate 23 was the RF ground. The selected $TaX_5$ vapor was combined with other process gases such as $H_2$ above the substrate, which had been heated to a temperature between about 300° C.–500° C. Ar and He could also be used, either singularly or in combination, as process gases in addition to $H_2$.

Process conditions for deposition of good quality PECVD $TaN_x$ films are given in Table 4, where slm is standard liters per minute and $W/cm^2$ is watts per centimeter squared.

TABLE 4

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $H_2$ flow | 1–10 slm |
| $N_2$ flow | 0.1–10 slm |
| Ar, He flow | 0–10 slm |
| Process Pressure | 0.2–5.0 Torr |
| RF Power | 0.1–5.0 $W/cm^2$ |

The $TaF_5$, $TaCl_5$ and $TaBr_5$ based PECVD $TaN_x$ film properties for process conditions using the method of the invention are given in Table 5. Representative values were selected from among the PECVD of $TaN_x$ from a $TaX_5$ precursor ($TaF_5$ number of experiments (n)=15, $TaCl_5$ n=8, $TaBr_5$ n=8) on 200 nm Si and $SiO_2$ substrates. In addition, PECVD of Ta/$TaN_x$ bilayers was also performed ($TaF_5$ n=3, $TaCl_5$ n=1, $TaBr_5$ n=1). The properties of the deposited $TaN_x$ films as listed in Table 5 were uniform within plus or minus 20% across the wafer.

resistivity for low interconnect impedances (less than 1000 $\mu\Omega$cm and preferably less than 500 $\mu\Omega$cm), and the film has good conformality and good step coverage (greater than 0.3). In addition, the level of impurities are low (less than 2 atomic percent). Also, the deposition rates are sufficient for throughput considerations (greater than 100 Å/min) and the process uses a low wafer temperature (less than 450° C.) and thus is compatible with other thin film materials used within the device including materials with dielectric constants lower than that of $SiO_2$.

The dependence of the film resistivities on the deposition temperature differed among the three precursors. At a temperature of 430° C. and at a $N_2$ flow of 0.5 slm, $TaF_5$ based films had a resistivity of 505 $\mu\Omega$cm. At a temperature of 400° C. and a $N_2$ flow of 2.5 slm, the resistivity increased to 1120 $\mu\Omega$cm. When the $N_2$ flow rate was increased to 5 slm while a temperature of 400° C. was maintained the resistivity further increased to 2160 $\mu\Omega$cm. Resistivity for PECVD $TaN_x$ films deposited using TaCl, as the precursor also increased as the $N_2$ flow rate increased. At a temperature of 350° C. and a $N_2$ flow rate of 0.5 slm, the resistivity was 945 $\mu\Omega$cm. At a temperature of 400° C. and a $N_2$ flow of 2.5 slm, the resistivity increased to 1564 $\mu\Omega$m. When the $N_2$ flow rate increased to 5 slm while a temperature of 400° C. was maintained, the resistivity further increased to 7865 $\mu\Omega$cm. Resistivity for $TaN_x$ films deposited using $TaBr_5$ as the precursor increased from 1177 $\mu\Omega$cm to 2300 $\mu\Omega$cm with a temperature maintained at 375° C. when the $N_2$ flow increased from 0.5 slm to 1.5 slm. Thus, for all three precursors, the resistivity of the $TaN_x$ film increased when the $N_2$ flow in the gas mix was increased. The increased resistivity is assumed to be due to the increase of nitrogen concentration in the film. This is consistent with previous results from $TaN_x$ films deposited either by PVD such as sputtering, or by organic-metal CVD (OMCVD), where increasing the ratio of nitrogen to tantalum dramatically increased the resistivity of the $TaN_x$ film.

Figure 11:
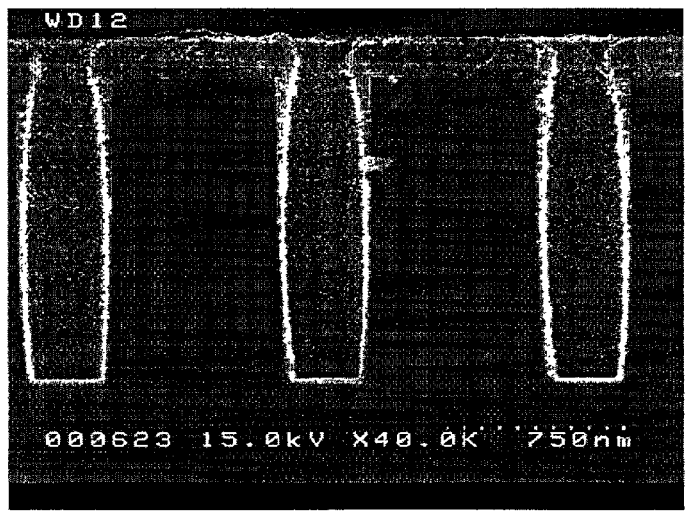
FIG. 11 is a photograph of a SEM of a PECVD tantalum nitride (TaN$_x$) film deposited using a TaF$_5$ precursor.
Figure 12:
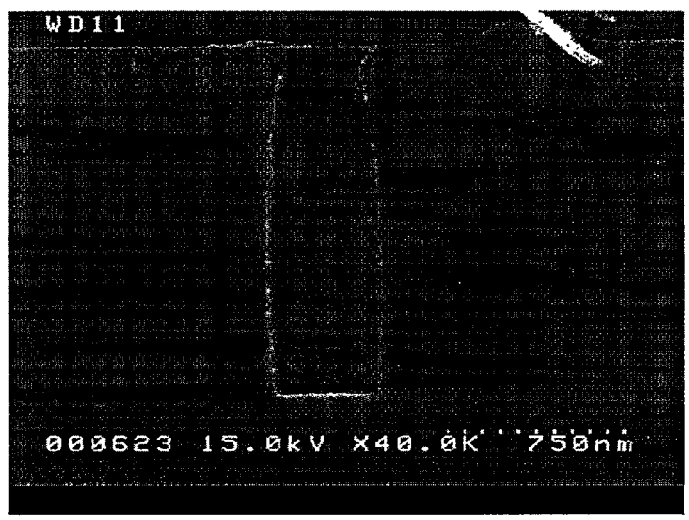
FIG. 12 is a photograph of a SEM of a PECVD TaN film deposited using a TaCl$_5$ precursor.
Figure 13:
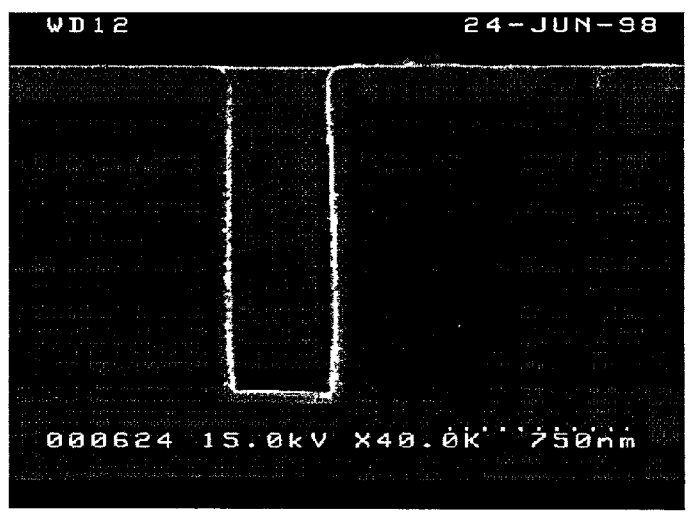
FIG. 13 is a photograph of a SEM of a PECVD TaN$_x$ film deposited using a TaBr$_5$ precursor.

Scanning electron micrographs (SEM) of $TaN_x$ films deposited by PECVD according to the invention were obtained and are shown in FIGS. 11–13. FIG. 11 is a SEM of a PECVD $TaN_x$ film using $TaF_5$ as the precursor, FIG. 12 is a SEM of a PECVD $TaN_x$ film using $TaCl_5$ as the precursor and FIG. 13 is a SEM of a PECVD $TaN_x$ film using $TaBr_5$ as the precursor.

Each of FIGS 11–13 shows a 3:1 aspect ratio structure with representative bottom step coverage and side wall coverage for each of the three precursors. The step coverage represents the film thickness on the bottom of the feature divided by the film thickness on the surface of the substrate

TABLE 5

| Film | Precursor | $TaX_5$ flow (sccm) | $N_2$ flow (slm) | $H_2$ flow (slm) | Pressure (Torr) | Temp. (° C.) | RF (Watts) | Dep. rate (Å/min.) | Resistivity ($\mu\Omega$cm) | Step Coverage |
|---|---|---|---|---|---|---|---|---|---|---|
| TaN | $TaF_5$ | 14 | 0.5 | 7 | 1.1 | 430 | 200 | 305 | 505 | 0.2 |
| TaN | $TaF_5$ | 14 | 2.5 | 7 | 1.4 | 400 | 200 | 755 | 1120 | 0.2 |
| TaN | $TaF_5$ | 14 | 5 | 5 | 1.6 | 400 | 200 | 1900 | 2160 | 0.2 |
| TaN | $TaCl_5$ | 14 | 0.5 | 7 | 1.1 | 350 | 200 | 525 | 945 | 0.2 |
| TaN | $TaCl_5$ | 14 | 2.5 | 7 | 1.4 | 400 | 500 | 613 | 1564 | 0.25 |
| TaN | $TaCl_5$ | 14 | 5 | 5 | 1.6 | 400 | 500 | 953 | 7865 | 0.13 |
| TaN | $TaBr_5$ | 2.5 | 0.5 | 7 | 1.1 | 375 | 100 | 107 | 1177 | 0.5 |
| TaN | $TaBr_5$ | 2.5 | 1.5 | 7 | 1.3 | 375 | 100 | 200 | 2300 | 0.2 |

The PECVD TaN film deposited by the method of the invention displays characteristics important to the formation of an IC. The film is in the range of low enough electrical adjacent the feature, also called the field. An ideal step coverage is 1.0 or 100%, representing identical thickness on the bottom as on the field. The $TaBr_5$ and $TaCl_5$ based PECVD TaN$_x$ films appeared to have better step coverage than the TaF$_5$ based PECVD TaN$_x$ films. As shown in Table 5, for TaBr$_5$ the step coverage was 0.50 and 0.20, for TaCl$_5$ the step coverage was 0.20, 0.25 and 0.13 and for TaF$_5$ the step coverage was consistently 0.2.

As shown in FIGS. 11–13, the PECVD TaN$_x$ films generally appeared to have good dense morphologies. The PECVD TaN$_x$ films using TaBr$_5$ and TaCl$_5$ as the precursors generally appeared to be smoother and PECVD TaN$_x$ films using TaF$_5$ as the precursor generally appeared rougher.

The compatibility of the PECVD TaN$_x$ film process of the present invention with copper was determined. Since in practice the TaN$_x$ film will be integral, that is, in direct contact with copper, little or no attack or etching of the copper should take place during TaN$_x$ deposition. TaN$_x$ compatibility with copper was tested by placing a Si wafer containing a 500 Å layer of TaN$_x$ deposited by PVD and a 2000 Å layer of copper deposited by PVD into the deposition chamber 11. A TaN$_x$ film was deposited by PECVD on top of the copper layer using the process of the invention with either a TaF$_5$ or TaCl$_5$ precursor.

Figure 14:
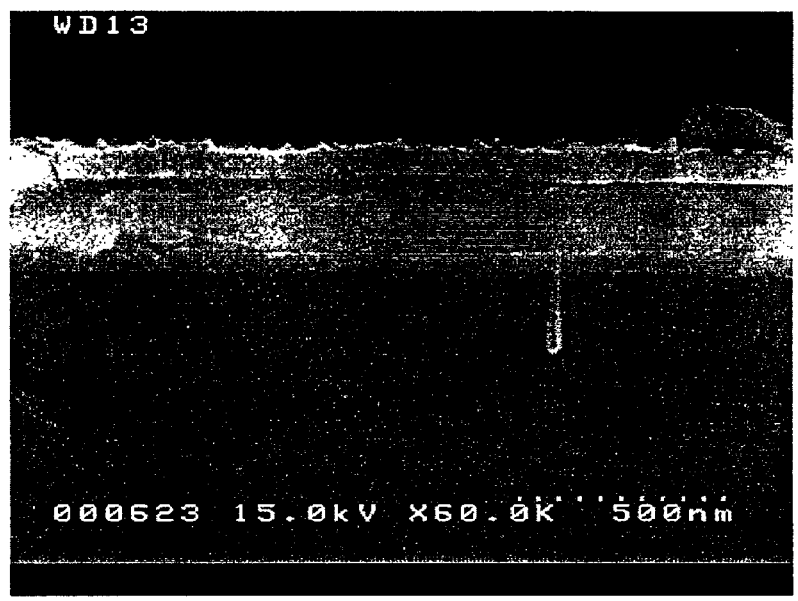
FIG. 14 is a photograph of a SEM of a TaF$_5$based film stack.
Figure 15:
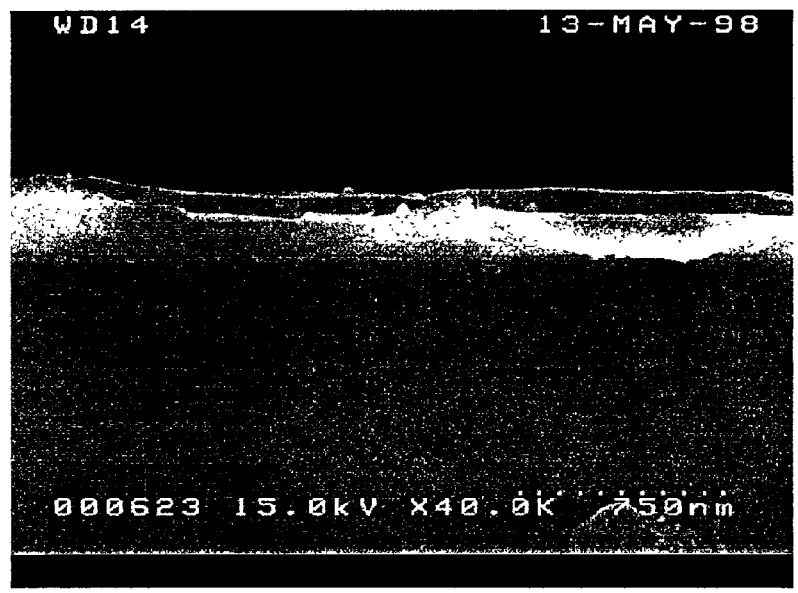
FIG. 15 is a photograph of a SEM of a TaCl$_5$ based film stack.

Photographs of SEM of the resulting films are shown in FIGS. 14 and 15. FIG. 14 shows a TaF$_5$ based TaN$_x$ film on a stack having layers of SiO$_2$/TiN/Cu/TaN$_x$. FIG. 15 shows a TaCl$_5$ based TaN$_x$ film on a stack having layers of SiO$_2$/TiN/Cu/TaN$_x$. The Cu layers have the same thicknesses of about 2000 Å as deposited. FIGS. 14–15 also show films having a relatively sharp interface for all layers. It can therefore be concluded that very little or no attack or etching occurs during PECVD of either TaF$_5$ or TaCl$_5$ precursor-based films. Based on these results, a TaBr$_5$ based TaN$_x$ film would also be expected to show compatibility with copper.

Figure 16:
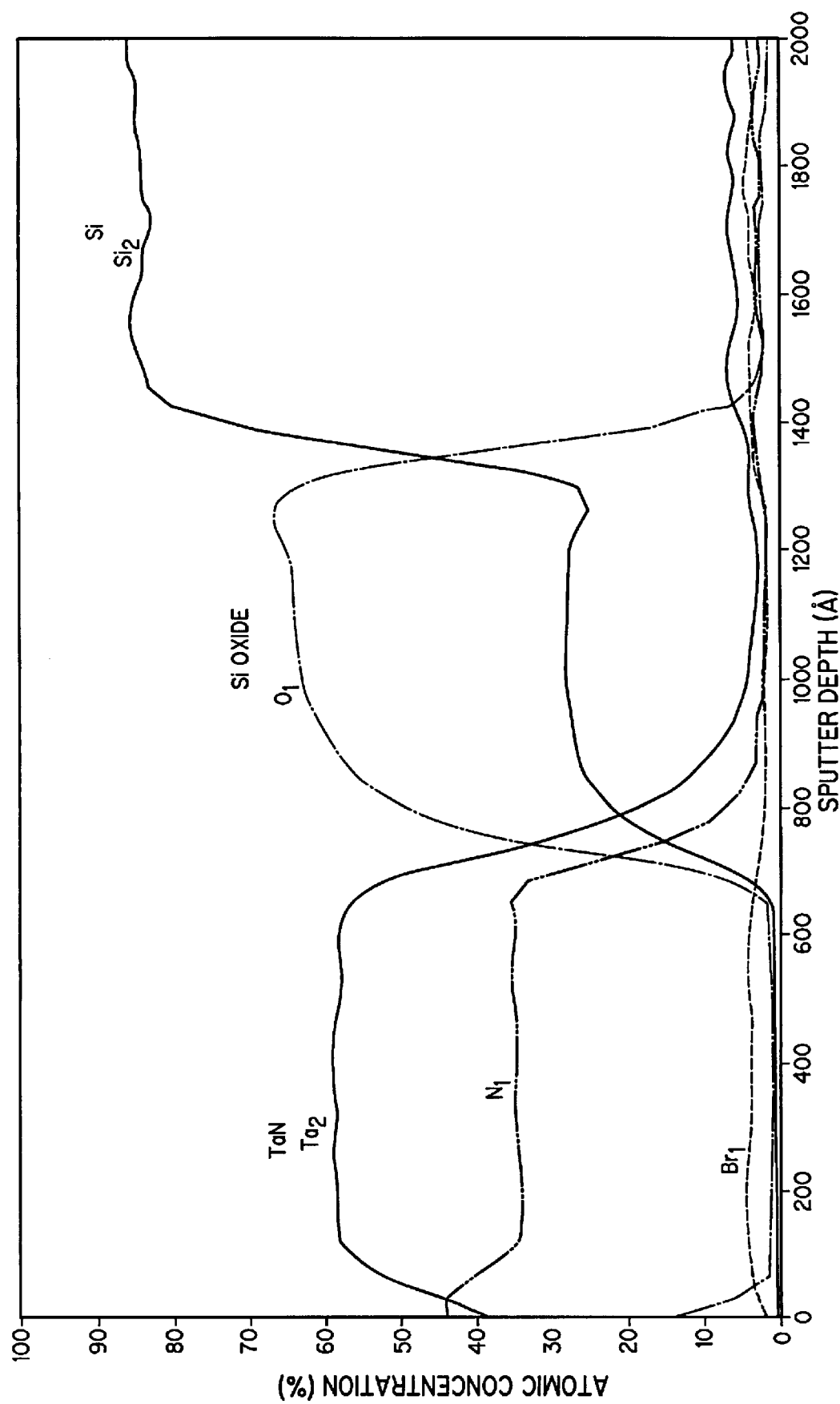
FIG. 16 is an Auger spectrum tracing of a PECVD TaN$_x$ film deposited using a TaBr$_5$ precursor deposited on SiO$_2$.
Figure 17:
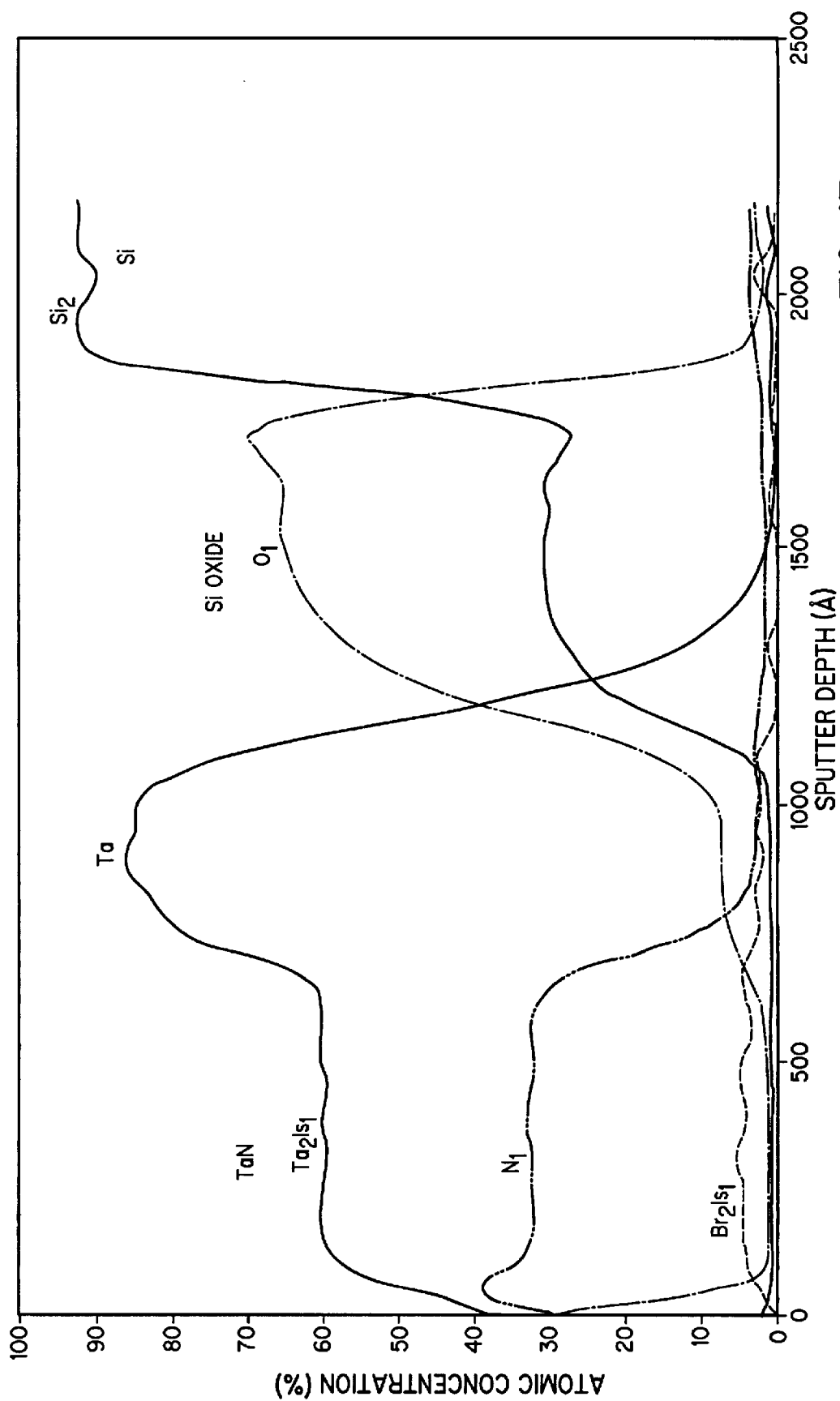
FIG. 17 is an Auger spectrum tracing of a PECVD TaN$_x$ film deposited using a TaBr$_5$ precursor deposited on a PECVD tantalum film.

Selected films were also evaluated by Auger electron spectroscopy. Auger analysis spectra are shown in FIGS. 16–17 with TaBr$_5$ used as the precursor for depositing TaN$_x$ on either a SiO$_2$ layer (FIG. 8) or on a PECVD TaBr$_5$ based Ta film (FIG. 17). Analysis of the Auger spectra confirmed the clean interface and the minimal diffusion between the copper and PECVD TaN$_x$ layers. The analysis also confirmed the low level of impurities present in the films. The figures indicate that these PECVD TaN$_x$ films were nitrogen poor (x<1.0), which is consistent with the results shown in Table 5. These films were deposited with the low N$_2$:H$_2$ ratio of 0.5:7, which was expected to result in a lower nitrogen-containing film. The normally exponentially rising electrical resistivity of TaN$_x$ when x>1.0 is observed in TaN$_x$ films deposited by both PVD and CVD. The figures show relatively sharp interfaces between all layers including with Cu. The bromide concentration was determined to be less than 2 atomic percent.

Therefore, a method of producing high quality PECVD TaN$_x$ films suitable for integration with IC interconnect elements that contain Cu has been demonstrated. The method is based on the vapor delivery of either TaF$_5$, TaCl$_5$ or TaBr$_5$ precursors. All of the resulting TaN$_x$ films from the three precursors demonstrated reasonable step coverage, low residual impurity concentrations, sufficiently high deposition rates and no signs of TaN$_x$ etching of Cu.

In the case of thermal CVD of TaN, the selected TaX$_5$ vapor was combined with ammonia (NH$_3$) above the substrate, which had been heated to a temperature between about 300° C.–500° C. Argon (Ar), nitrogen (N$_2$), hydrogen (H$_2$) and helium (He) could also be used, either singularly or in combination, as process gases. Process conditions for deposition of good quality thermal CVD tantalum nitride films are given in Table 6, where slm is standard liters per minute and W/cm$^2$ is watts per centimeter squared.

TABLE 6

| | |
|---|---|
| Substrate Temperature | 300° C.–500° C. |
| TaX$_5$ temperature | 95° C. (TaF$_5$), 145° C. (TaCl$_5$), 205° C. (TaBr$_5$) |
| TaX$_5$ flow | 1–50 sccm |
| H$_2$ flow | 0–10 slm |
| Ar, He flow | 0–10 slm |
| Process Pressure | 0.2–5.0 Torr |
| NH$_3$ flow | 0.1–10 slm |
| N$_2$ flow | 0–10 slm |

The TaF$_5$ and TaBr$_5$ based thermal CVD TaN$_x$ film properties for process conditions using the method of the invention are given in Table 7. Representative values were selected from among the depositions of TaN$_x$ from a Ta(X)$_5$ precursor (TaF$_5$ n=10, TaBr$_5$ n=22) on 200 mm silicon (Si) and silicon dioxide (SiO$_2$) substrates. In addition, Ta/TaN$_x$ bilayers were also deposited (TaF$_5$ n=3, TaBr$_5$ n=1). The properties of the deposited TaN$_x$ films as listed in Table 7 were uniform within plus or minus 20% across the wafer.

TABLE 7

| Film | Precursor | TaX$_5$ flow (sccm) | NH$_3$ flow (slm) | Pressure (Torr) | Temp. (° C.) | Deposition Rate (Å/min) | Resistivity ($\mu\Omega$cm) | Step Coverage | Halogen conc. (atomic %) |
|---|---|---|---|---|---|---|---|---|---|
| TaN | TaF$_5$ | 6 | 1 | 0.3 | 415 | 850 | >1 × 10$^7$ | 0.2 | <2 |
| TaN | TaF$_5$ | 10 | 1 | 0.3 | 415 | 1000 | 7 × 10$^6$ | 1 | <2 |
| TaN | TaF$_5$ | 28 | 1 | 0.3 | 415 | 1115 | 4 × 10$^5$ | 1 | <2 |
| TaN | TaBr$_5$ | 10 | 1 | 1 | 425 | 200 | <1 × 10$^7$ | 0.6 | <2 |

The thermal CVD TaN film deposited by the method of the invention displays characteristics important to the formation of an IC. The film is in the range of low enough electrical resistivity for low interconnect impedances (less than 1000 $\mu\Omega$cm and preferably less than 500 $\mu\Omega$cm), and the film has good conformality and good step coverage (greater than 0.3). In addition, the level of impurities are low (less than 2 atomic percent). Also, the deposition rates are sufficient for throughput considerations (greater than 100 Å/min) and the process uses a low wafer temperature (less than 450° C.) and thus is compatible with other thin film materials used in the device, including materials with dielectric constants lower than that of SiO$_2$.

At a temperature of 415° C., a pressure of 0.3 Torr and a NH$_3$ flow of 1.0 slm, a thermal CVD TaN$_x$ film deposited using a TaF$_5$ precursor at a flow of 6 sccm had a resistivity of greater than about 1×10$^7$ $\mu\Omega$cm. Under these conditions the deposition rate was 850 Å/min and the step coverage was 0.2. As the TaF$_5$ precursor flow was increased to 10 sccm with the temperature maintained at 415° C., the pressure maintained at 0.3 Torr and the NH$_3$ flow maintained at 1.0 slm, the resistivity decreased to 7×10$^6$ $\mu\Omega$cm. At this TaF$_5$ flow of 10 sccm, the deposition rate increased to 1000 Å/min and the step coverage increased to 1.0. As the TaF$_5$ precursor flow was further increased to 28 sccm with the temperature maintained at 415° C., the pressure maintained at 0.3 Torr and the NH$_3$ flow maintained at 1.0 slm, the resistivity further decreased to 4×10$^5$ μΩM. At this TaF$_5$ flow of 28 sccm, the deposition rate increased to 1115 Å/min while the step coverage remained at 1.0. At a temperature of 425° C., a pressure of 1.0 Torr and at a NH$_3$ flow of 1.0 slm, a TaN film deposited using a TaBr$_5$ precursor at a flow of 10 sccm had a resistivity of greater than about 1×10$^7$ μΩcm. Under these conditions the deposition rate was 200 Å/min and the step coverage was 0.6.

Figure 18:
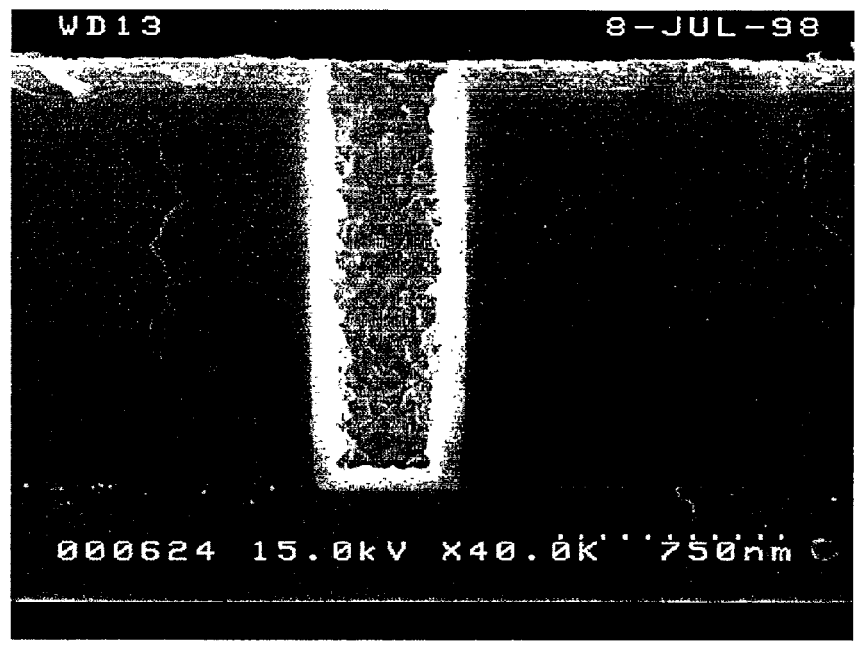
FIG. 18 is a photograph of a SEM of a thermal CVD TaN$_x$ film deposited using a TaF$_5$ precursor.
Figure 19:
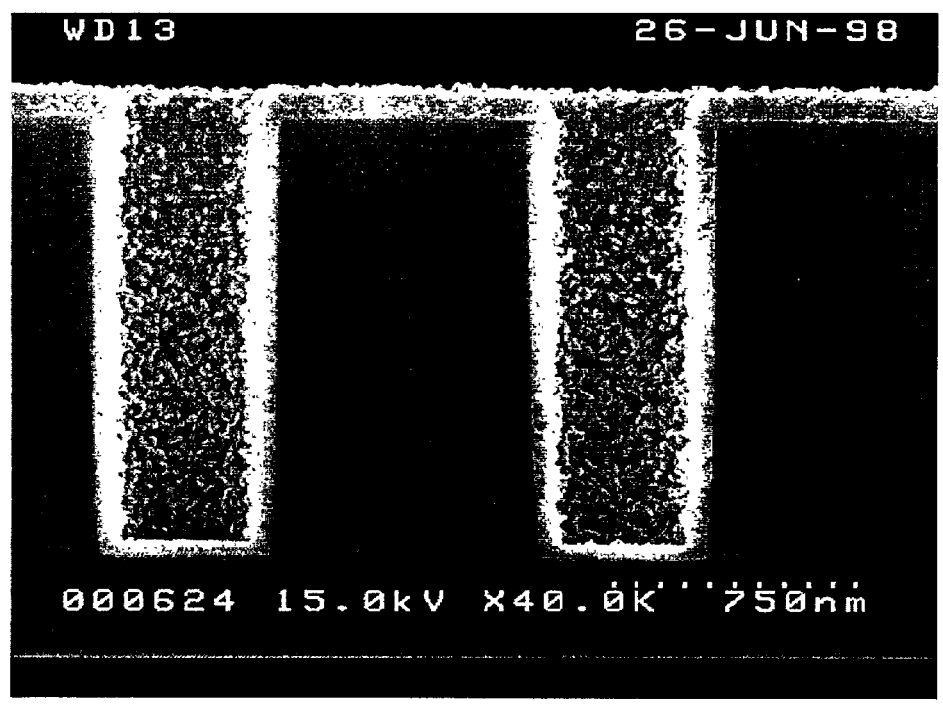
FIG. 19 is a photograph of a SEM of a thermal CVD TaN$_x$ film deposited using a TaBr$_5$ precursor.

Scanning electron micrographs (SEM) of TaN$_x$ films deposited by thermal CVD according to the invention were obtained and are shown in FIGS. 18–19. FIG. 18 is a SEM of a TaN$_x$ film using TaF$_5$ as the precursor. FIG. 19 is a SEM of a TaN$_x$ film using TaBr$_5$ as the precursor.

FIG. 18 and FIG. 19 shows a 3:1 aspect ratio structure with representative bottom step coverage and side wall coverage for TaF$_5$ and TaBr$_5$ precursors. The step coverage represents the film thickness on the bottom of the feature divided by the film thickness on the surface of the substrate adjacent the feature, also called the field. As shown in Table 7, the step coverage for TaF$_5$ precursor TaN$_x$ films with a TaF$_5$ flow of 6 sccm was 0.2. The step coverage increased to 1.0 when the TaF$_5$ flow was increased to either 10 sccm or 28 sccm while the temperature was maintained at 415° C. The step coverage for TaBr$_5$ precursor TaN films was 0.6 at a TaBr$_5$ flow of 10 sccm and a temperature of 425° C. The TaF$_5$ based TaN$_x$ film appeared to have better step coverage than the TaBr$_5$ based TaN film.

As shown in FIG. 18 and FIG. 19, the thermal CVD TaN$_x$ films generally appeared to have good dense morphologies. The TaBr$_5$ based TaN$_x$ film generally appeared to be smoother than the TaF$_5$ based film, which appeared rougher. Based on experience with other films using TaF$_5$ and TaBr$_5$ precursors, it is presumed that TaCl$_5$ based TaN$_x$ films deposited according to the method of the invention would yield an intermediate step coverage and film morphology between TaF$_5$ and TaBr$_5$ based TaN$_x$ films.

The compatibility of the thermal CVD TaN film process of the present invention with copper was determined. Since in practice the TaN film will be integral, that is, in direct contact with copper, little or no attack or etching of the copper should take place during TaN deposition. TaN compatibility with copper was tested by placing a Si wafer containing a 500 Å layer of titanium nitride (TiN) deposited by PVD and a 2000 Å layer of copper deposited by PVD into the reaction chamber 11. A TaN film was deposited by thermal CVD on top of the copper layer using the process of the invention with either a TaF$_5$, TaCl$_5$ or TaBr$_5$ precursor.

Figure 20:
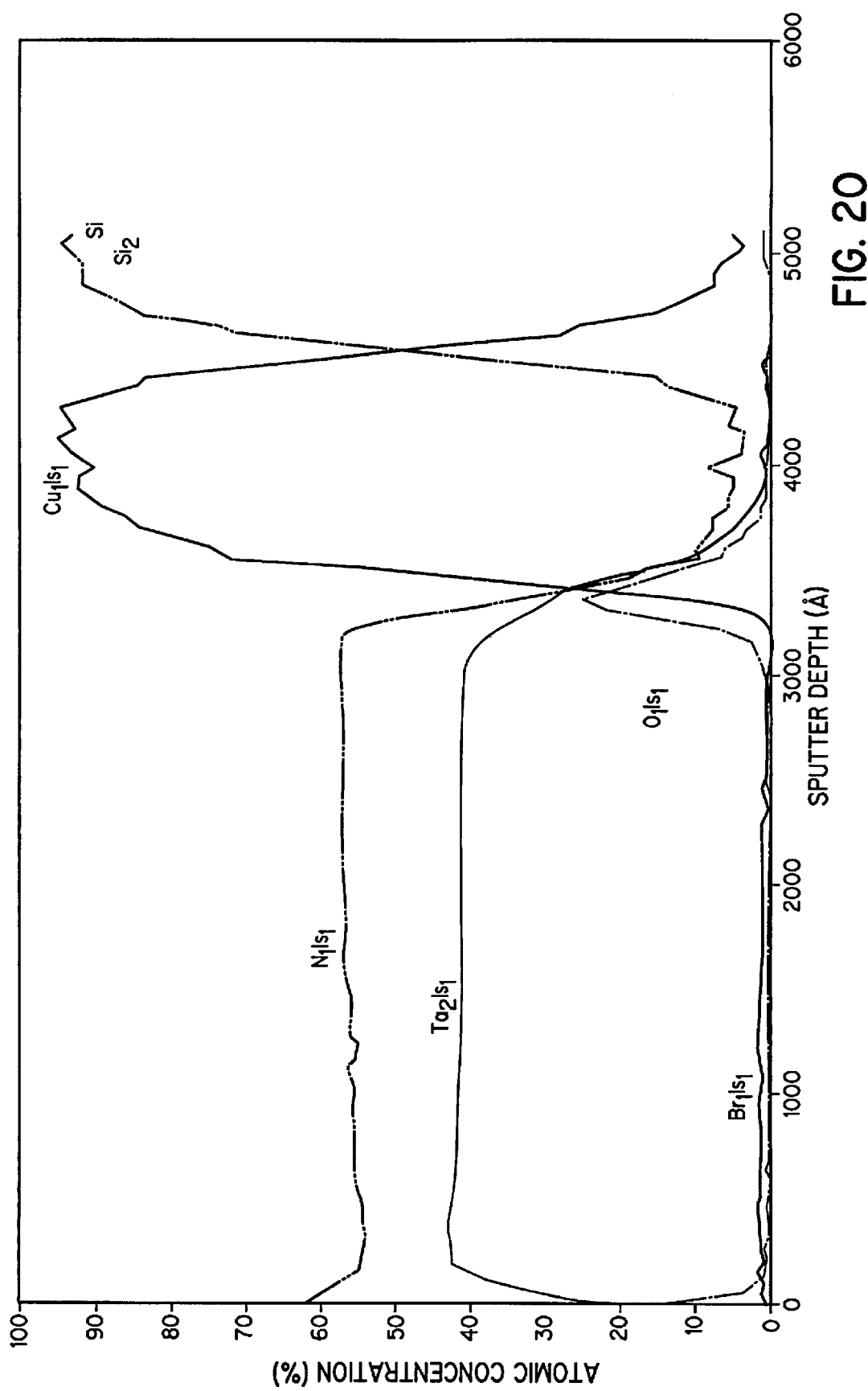
FIG. 20 is an Auger spectrum tracing of a thermal CVD TaN$_x$ film deposited using a TaBr$_5$ precursor deposited on a copper layer.

The resulting film was evaluated by Auger electron spectroscopy. Analysis of the Auger spectrum confirmed the clean interface and the minimal diffusion between the Cu and TaN$_x$ layer. The analysis also determined the level of impurities present in the film. The Auger analysis spectrum is shown in FIG. 20 with TaBr$_5$ used as the precursor for depositing TaN$_x$ on a Cu layer in a Cu/TiN/Si stack. FIG. 20 indicates that the TaN$_x$ film was nitrogen rich (x>1.0), which is consistent with the results shown in Table 7. The N$_2$ rich TaN$_x$ film is expected to have a relatively high electrical resistivity. FIG. 20 also shows a good sharp interface between the TaN$_x$ layer and Cu, which suggests little or no attack of the Cu surface during TaN deposition. The bromide concentration was determined to be less than 2 atomic percent.

Therefore, a method of producing high quality thermal CVD TaN film suitable for integration with IC interconnect elements that contain Cu has been demonstrated. The method is based on the vapor delivery of either TaF$_5$, TaCl$_5$ or TaBr$_5$ precursors. All of the resulting TaN$_x$ films from the three precursors demonstrated reasonable step coverage, low residual impurity concentrations, sufficiently high deposition rates and no signs of TaN$_x$ etching of copper. Of the precursors, TaF$_5$ based TaN$_x$ films deposited by thermal CVD according to the method of the invention appear most promising due to the high deposition rate and 100% step coverage.

The TaF$_5$, TaCl$_5$ and TaBr$_5$ based Ta/TaN$_x$ bilayer film properties for process conditions using the method of the invention are given in Table 8. All films were PECVD Ta and PECVD TaN$_x$.

TABLE 8

| Precursor | TaX$_5$ flow (sccm) | N$_2$ flow (slm) | H$_2$ flow (slm) | Pressure (Torr) | Temp. (° C.) | RF (Watts) | Deposition Rate (Å/min) | Resistivity (μΩcm) | Step Coverage |
|---|---|---|---|---|---|---|---|---|---|
| TaF$_5$ | 14 |  | 7 | 1 | 430 | 200 | 153 | 115 | 0.5 |
|  | 14 | .05 | 7 | 1.1 | 430 | 200 |  |  |  |
| TaF$_5$ | 14 |  | 7 | 1 | 350 | 200 | 190 | 85 |  |
|  | 14 | 0.5 | 7 | 1.1 | 350 | 200 |  |  |  |
| TaF$_5$ | 14 |  | 7 | 1 | 400 | 200 | 264 | 211 | 0.19 |
|  | 14 | 2.5 | 7 | 1.4 | 400 | 200 |  |  |  |
| TaCl$_5$ | 14 |  | 7 | 1 | 400 | 200 | 578 | 1995 | 0.19 |
|  | 14 | 2.5 | 7 | 1.4 | 400 | 200 |  |  |  |
| TaBr$_5$ | 5 |  | 7 | 1 | 430 | 100 | 162 | 645 | 0.37 |
|  | 5 | 0.5 | 7 | 1.1 | 430 | 100 |  |  |  |

The integrated films deposited by the method of the invention display characteristics important to the formation of an IC. There is a good smooth interface and good adhesion between the Ta and TaN$_x$ layers. The film is in the range of low enough electrical resistivity for low interconnect impedances (less than 1000 μΩcm and preferably less than 500 μΩcm), and the film has good conformality and good step coverage (greater than 0.3). In addition, the level of impurities are low (less than 2 atomic percent). Also, the deposition rates are sufficient for throughput considerations (greater than 100 Å/min) and the process uses a low wafer temperature (less than 450° C.) and thus is compatible with other thin film materials used within the device including materials with dielectric constants lower than that of SiO$_2$.

The dependence of the film resistivities on the deposition temperature differed among the three precursors. For Ta/TaN$_x$ integrated films deposited by PECVD Ta and PECVD TaN$_x$ films using TaF$_5$ precursors, at a temperature of 430° C. and at a N$_2$ flow of 0.5 slm, the film had a resistivity of about 115 μΩcm. At a temperature of 350° C. and a N$_2$ flow of 0.5 slm, the film resistivity decreased to 85 μΩcm. When the N$_2$ flow rate was increased to 2.5 slm with a temperature of 400° C., the resistivity increased to 211 μΩcm. For Ta/TaN$_x$ films using TaCl$_5$ as the precursor, at a temperature of 400° C. a N$_2$ flow rate of 2.5 slm, the resistivity was 1995 μΩcm. For Ta/TaN$_x$ films deposited using TaBr$_5$ as the precursor, at a temperature of 430° C. and a N$_2$ flow of 0.5 slm, the resistivity was 645 μΩcm. Thus, for all three precursors, the resistivity of the Ta/TaN$_x$ film was high when the N$_2$ flow in the gas mix was increased. The increased resistivity is assumed to be due to the increase of nitrogen concentration in the film. This is consistent with previous results from Ta/TaN$_x$ films deposited either by PVD methods such as sputtering, or by organic-metal CVD (OMCVD), where increasing the ratio of nitrogen to tantalum dramatically increased the resistivity of the Ta/TaN$_x$ film.

Figure 21:
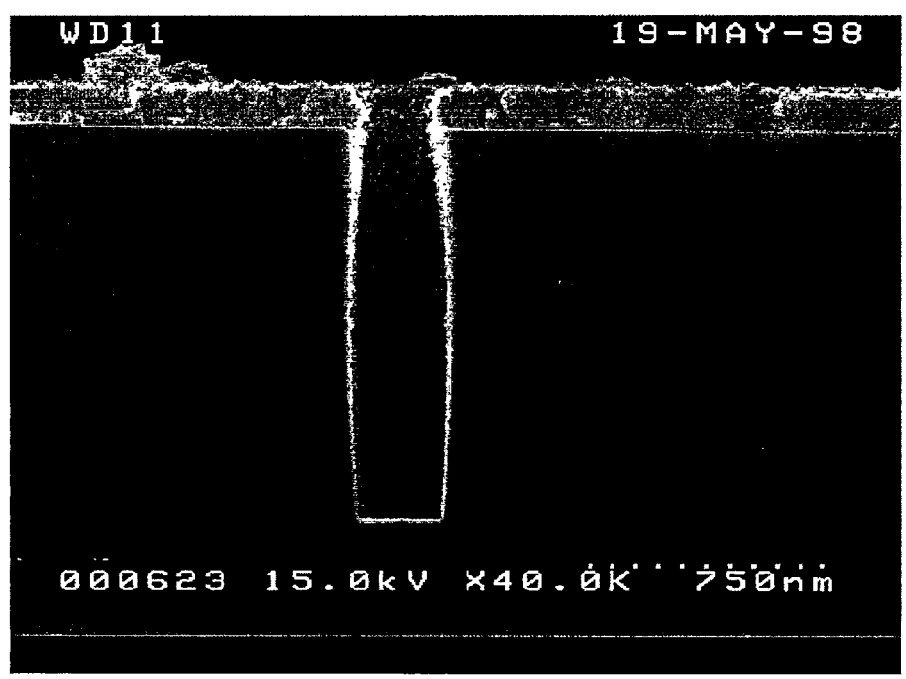
FIG. 21 is a photograph of a SEM of a PECVD Ta/TaN$_x$ bilayer film using a TaF$_5$ precursor.
Figure 22:
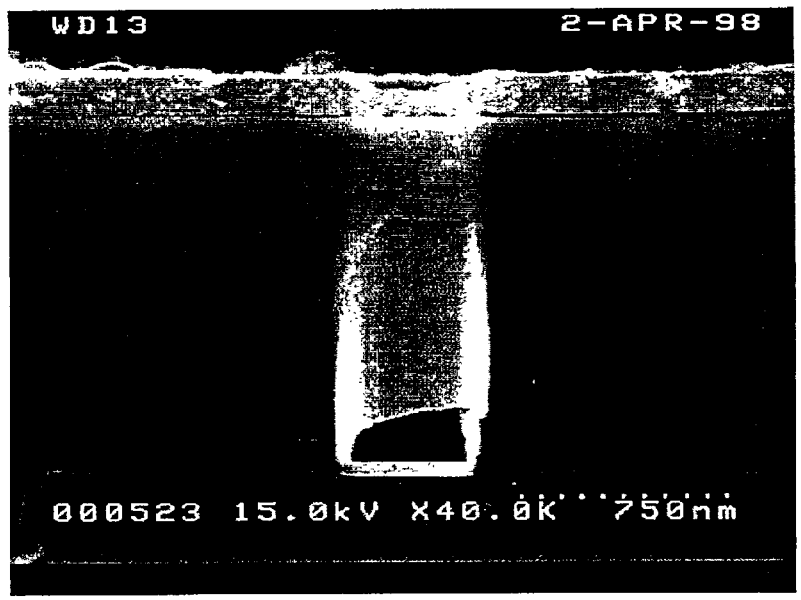
FIG. 22 is a photograph of a SEM of a PECVD Ta/TaN$_x$ bilayer film using a TaBr$_5$ precursor.

Scanning electron micrographs (SEM) of Ta/TaN$_x$ bilayer films deposited by PECVD according to the invention were obtained and are shown in FIG. 21 and FIG. 22. FIG. 21 is a SEM of a Ta/TaN$_x$ bilayer film using TaF$_5$ as the precursor, and FIG. 22 is a SEM of a Ta/TaN$_x$ bilayer film using TaBr$_5$ as the precursor. The TaBr$_5$ based PECVD Ta/TaN$_x$ bilayer films appear to have better step coverage than the TaF$_5$ Ta/TaN$_x$ films. It is hypothesized that TaCl$_5$ based PECVD Ta/TaN$_x$ bilayer films would also have better step coverage than the TaF$_5$ Ta/TaN$_x$ films.

FIG. 21 and FIG. 22 show a substrate containing a feature with an aspect ratio structure with representative bottom step coverage and side wall coverage for each of the precursors. The step coverage represents the film thickness on the bottom of the feature divided by the film thickness on the surface of the substrate adjacent the feature, also called the field. An ideal step coverage is 1.0 or 100%, representing identical thickness on the bottom as on the field. The TaBr$_5$ and TaCl$_5$ based PECVD Ta/TaN$_x$ films generally appeared to be smoother than the TaF$_5$ based PECVD Ta/TaN$_x$ film, which appeared the roughest. As shown in Table 8, for TaBr$_5$ the step coverage was 0.37, for TaCl$_5$ the step coverage was 0.19 and for TaF$_5$ the step coverage in two integrated films was 0.5 and 0.19.

The compatibility of the Ta/TaN$_x$ film process of the present invention with copper was determined. Since in practice the Ta/TaN$_x$ film will be integral, that is, in direct contact with copper, little or no attack or etching of the copper should take place during Ta/TaN$_x$ deposition. Ta/TaN$_x$ compatibility with copper was tested by placing a Si wafer containing a 500 Å layer of TiN$_x$ deposited by PVD and a 2000 Å layer of copper deposited by PVD into the reaction chamber 11. A TaN$_x$ film was deposited by PECVD on top of the copper layer using the process of the invention with either a TaF$_5$ or TaCl$_5$ precursor.

Figure 23:
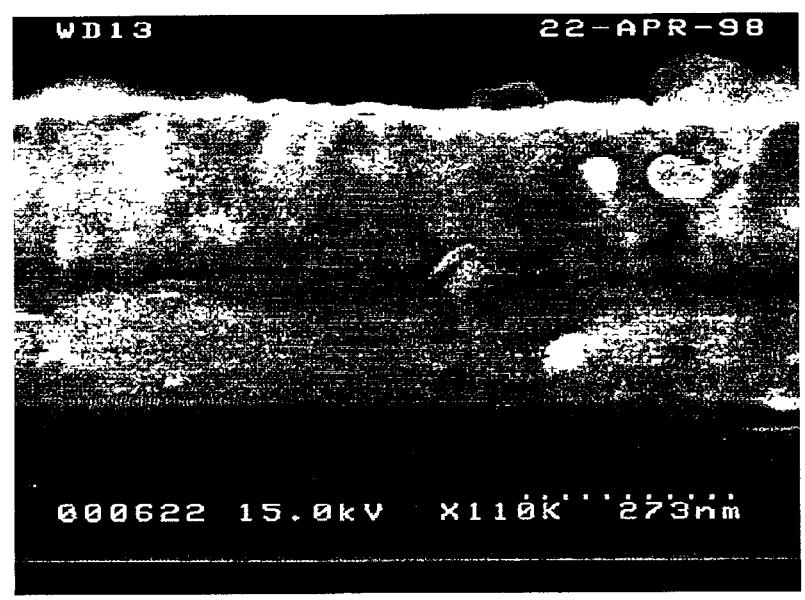
FIG. 23 is a photograph of a SEM of a TaF$_5$ based film stack.
Figure 24:
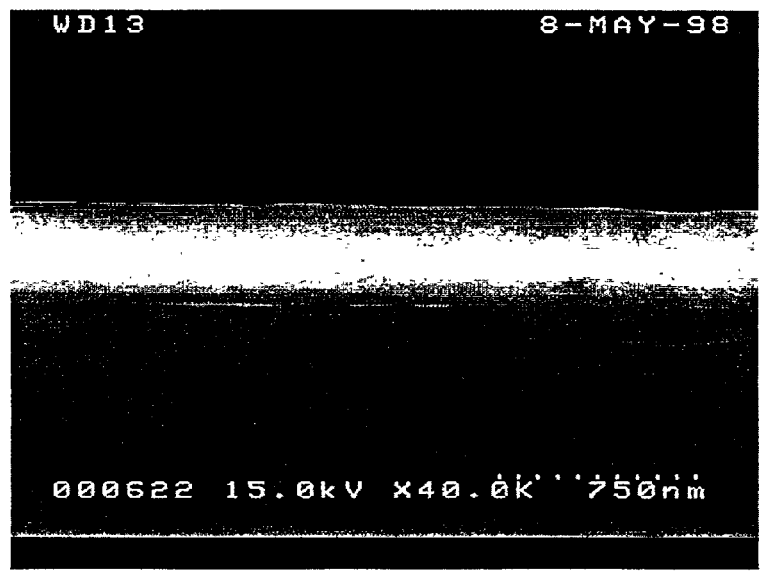
FIG. 24 is a photograph of a SEM of a TaCl$_5$ based film stack.
Figure 25:
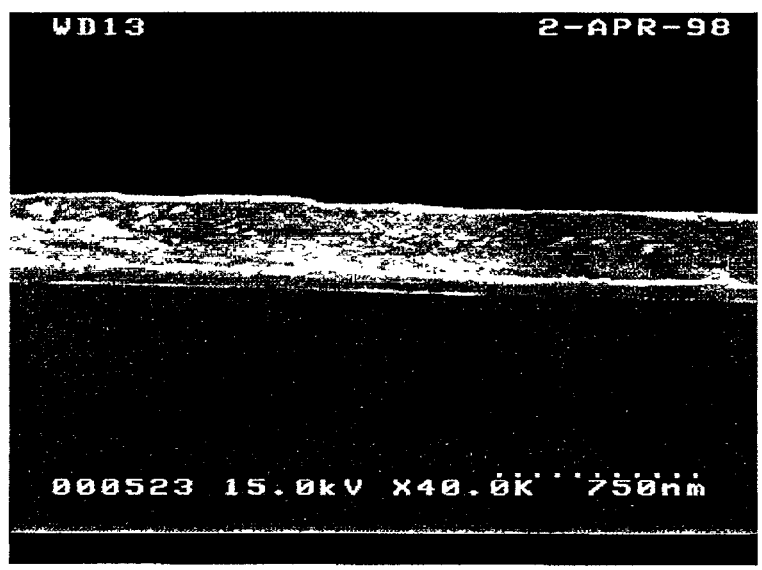
FIG. 25 is a photograph of a SEM of a TaBr$_5$ based film stack.

Photographs of SEM images of the resulting films are shown in FIGS. 23–25. FIG. 23 shows a TaF$_5$ based PECVD Ta/TaN$_x$ bilayer on a Cu film deposited by PVD. FIG. 24 shows a TaCl$_5$ based PECVD Ta/TaN$_x$ bilayer on a Cu film deposited by PVD. FIG. 25 shows a TaCl$_5$ based PECVD Ta/TaN$_x$ bilayer on a Cu film deposited by PVD. The Cu layers have the same thicknesses of about 2000 Å as they were deposited and in combination with the clean interface with the PECVD Ta/TaN$_x$. FIGS. 23–25 also indicate a clean and smooth interface between the Cu layer and the PECVD Ta/TaN$_x$ bilayer. It can therefore be concluded that very little or no attack or etching occurs during PECVD of either TaF$_5$, TaCl$_5$ or TaBr$_5$ precursor-based PECVD Ta/TaN$_x$ films.

Figure 26:
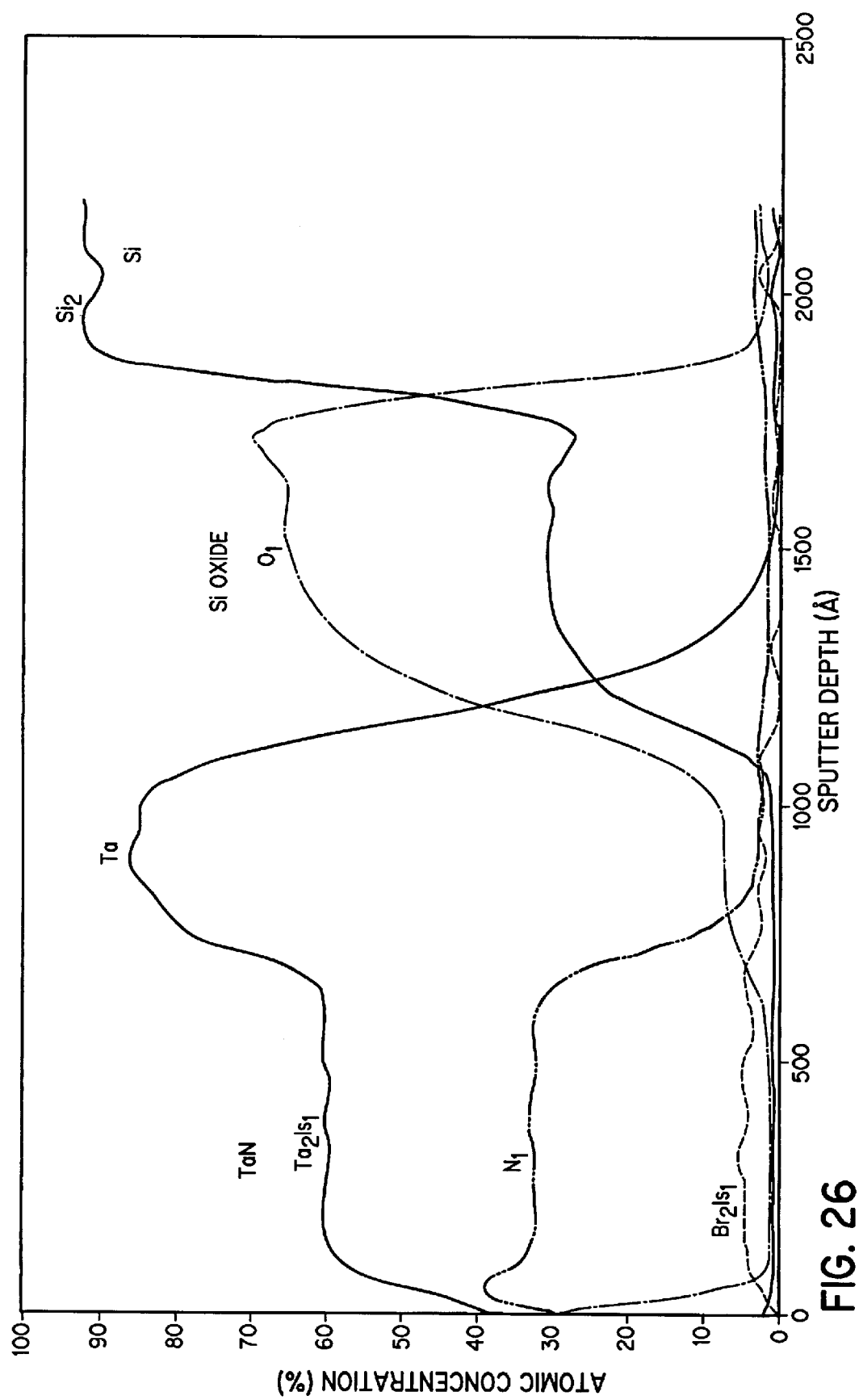
FIG. 26 is an Auger spectrum tracing of a Ta/TaN$_x$ bilayer film using a TaBr$_5$ precursor deposited on SiO$_2$.
Figure 27:
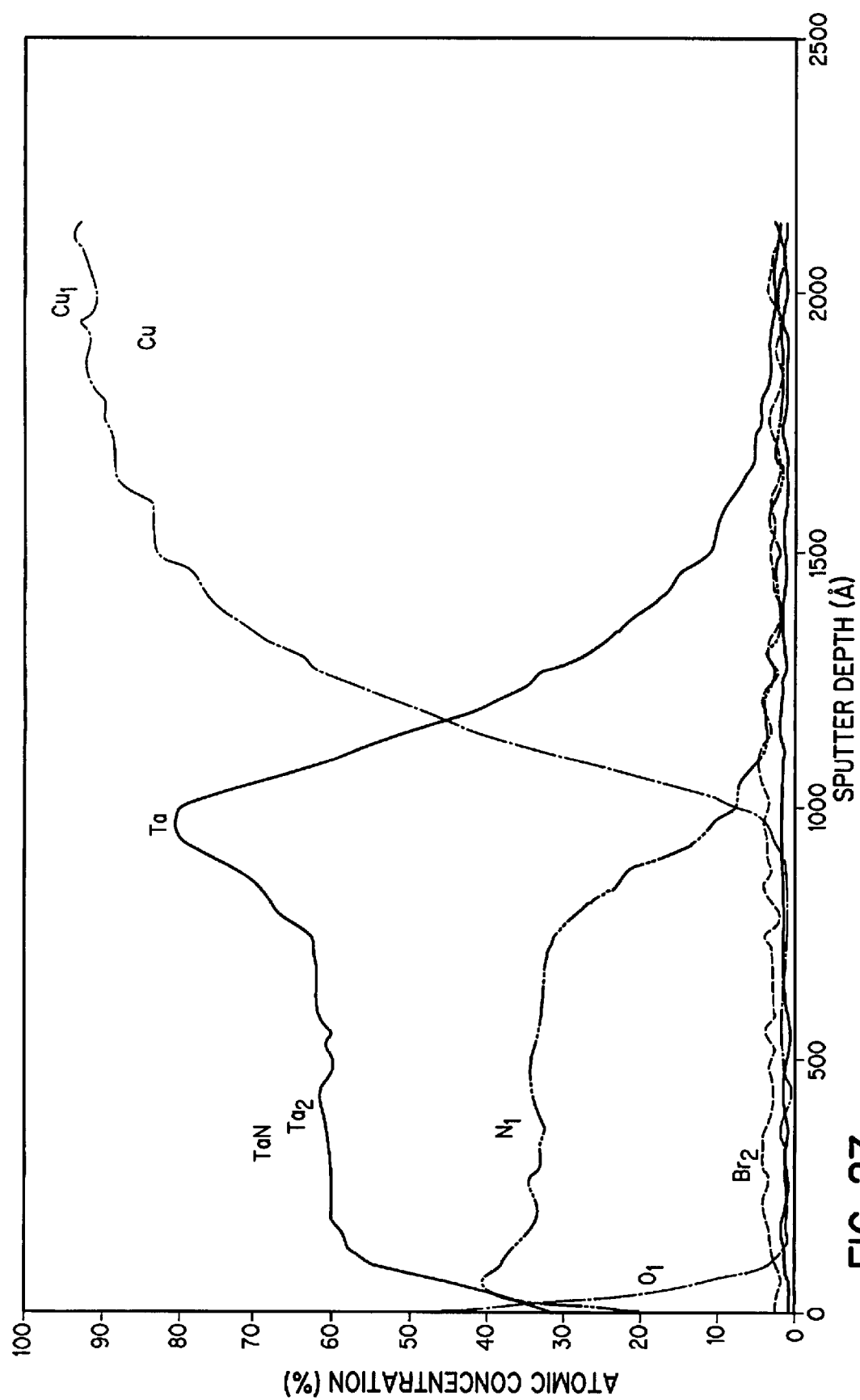
FIG. 27 is an Auger spectrum tracing of a Ta/TaN$_x$ bilayer film using a TaBr$_5$ precursor deposited on PVD copper.

Selected films were also evaluated by Auger electron spectroscopy and the results are shown in FIGS. 26–27. An Auger analysis spectrum with TaBr$_5$ used as the precursor for depositing Ta/TaN$_x$ on a SiO$_2$ layer is shown in FIG. 26. An Auger analysis spectrum with TaBr$_5$ used as the precursor for depositing Ta/TaN$_x$ on the abovementioned Cu layer deposited by PVD is shown in FIG. 27. Analysis of the Auger spectra confirmed the clean interface between the TaN$_x$ and other layers. The analysis also confirmed the low level of impurities present in the films. The figures indicate that the PECVD TaN$_x$ films were nitrogen poor (x<1.0), which is consistent with the results shown in Table 8. These films were deposited with the low N$_2$:H$_2$ ratio of 0.5:7, which was expected to result in a lower nitrogen-containing film. The normally exponentially rising electrical resistivity of TaN$_x$ when x>1.0 is observed in TaN$_x$ films deposited by both PVD and CVD. The figures show relatively sharp interfaces between all layers, which indicated very little Cu diffusion into the bilayer. The bromide concentration was determined to be less than 2 atomic percent.

Therefore, a method of producing high quality PECVD Ta/TaN$_x$ bilayer films suitable for integration with IC interconnect elements that contain copper has been demonstrated. The method is based on the vapor delivery of either TaF$_5$, TaCl$_5$ or TaBr$_5$ precursors. All of the resulting Ta/TaN$_x$ films from the three precursors demonstrated reasonable step coverage, low residual impurity concentrations, sufficiently high deposition rates and no signs of TaN$_x$ etching of copper.

It should be understood that the embodiments of the present invention shown and described in the specification are only preferred embodiments of the inventors who are skilled in the art and are not limiting in any way. For example, the Ta/TaN$_x$ bilayer may be formed by PECVD of Ta and thermal CVD of TaN$_x$. Therefore, various changes, modifications or alterations to these embodiments may be made or resorted to without departing from the spirit of the invention and the scope of the following claims.

What is claimed is:

1. A method of depositing a tantalum-based film on a semiconductor device substrate having a temperature in the range of about 300° C.–500° C., the method comprising providing a vapor of a tantalum pentafluoride precursor to a reaction chamber containing said substrate by heating said precursor to a temperature sufficient to vaporize said precursor, then combining said vapor in said reaction chamber with a process gas to deposit said film on said substrate, wherein said deposited film contains less than about 2 at. % fluorine, and wherein the method includes at least one step selected from the group consisting of:

a) combining said vapor above said substrate with said process gas consisting essentially of N$_2$ and H$_2$ and optional inert gases to deposit a TaN$_x$ film on said substrate by a plasma enhanced chemical vapor deposition (PECVD) process;

b) combining said vapor with said process gas consisting essentially of nitrogen and hydrogen and optionally one or more of argon and helium by providing said process gas to said reaction chamber concurrently with providing said vapor to said reaction chamber to deposit a TaN$_x$ film on said substrate by a thermal chemical vapor deposition (CVD) process; and c) combining said vapor with said process gas consisting essentially of hydrogen and optionally one or more of argon and helium and generating a plasma in said combined vapor and process gas and reacting said combined vapor and process gas in the presence of said plasma to deposit a Ta film on said substrate by a plasma enhanced chemical vapor deposition (PECVD) process.

2. The method of claim 1 wherein said heating of said precursor is to a temperature sufficient to provide a vapor pressure of said precursor of at least 3 Torr.

3. The method of claim 1 wherein said heating of said precursor is to a temperature of about 95° C.

4. The method of claim 1 wherein said depositing occurs at a pressure of said chamber in the range of about 0.2–5.0 Torr.

5. The method of claim 1 wherein said film is integral with a copper layer of said substrate.

6. The method of claim 1 wherein said film is deposited at a rate of at least about 100 Å/min.

7. The method of claim 1 wherein said substrate comprises an integrated circuit containing a high aspect ratio feature.

8. The method of claim 1 wherein said precursor is delivered to said reaction chamber without a carrier gas.

9. A method of depositing a tantalum nitride ($TaN_x$) film on a semiconductor device substrate having a temperature in the range of about 300° C.–500° C., the method comprising providing a vapor of a tantalum pentafluoride precursor to a reaction chamber containing said substrate by hearing said precursor to a temperature sufficient to vaporize said precursor, then combining said vapor above said substrate with a process gas consisting essentially of $N_2$ and $H_2$ and optional inert gases to deposit said $TaN_x$ on said substrate by a plasma enhanced chemical deposition (PECVD) process, wherein said deposited $TaN_x$ film contains less than about 2 at. % fluorine.

10. The method of claim 9 wherein said providing of said vapor includes producing said vapor at a pressure of at least about 3 Torr.

11. The method of claim 9 wherein said heating of said precursor is to a temperature sufficient to provide a vapor pressure of said precursor of at least 3 Torr.

12. The method of claim 9 wherein said delivery of said precursor is in the range of about 1–50 sccm.

13. The method of claim 9 wherein said process gas includes an inert gas selected from the group consisting of argon, helium and combinations thereof.

14. The method of claim 9 wherein said $H_2$ gas is at a flow of about 1–10 slm.

15. The method of claim 9 wherein said $N_2$ gas is at a flow in the range of about 0.1–10 slm.

16. The method of claim 9 wherein said depositing occurs at a pressure of said chamber in the range of about 0.2–5.0 Torr.

17. The method of claim 9 wherein said film is integral with a copper layer of said substrate.

18. The method of claim 9 wherein said $TaN_x$ is deposited at a rate of at least about 100 Å/min.

19. The method of claim 9 wherein said substrate comprises an integrated circuit containing a high aspect ratio feature.

20. The method of claim 9 wherein said precursor is delivered to said reaction chamber without a carrier gas.

21. The method of claim 9 further comprising depositing said $TaN_x$ film sequentially with a tantalum film.

22. The method of claim 9 wherein said temperature is less than a temperature that would cause a reaction between said precursor vapor and said process gas.

23. The method of claim 9 wherein said heating of said precursor is to a temperature of about 95° C.

24. A method of depositing a tantalum nitride ($TaN_x$) film on a substrate comprising delivering a tantalum pentafluoride precursor to a reaction chamber containing said substrate by heating said precursor to a temperature in the range of about 83° C. to about 95° C. to produce a vapor of said precursor to provide a pressure of at least about 3 Torr to deliver a tantalum vapor, combining said vapor above said substrate with a process gas consisting essentially of $N_2$ and $H_2$ and optional inert gases, and depositing said $TaN_x$ on said substrate by a plasma enhanced chemical vapor deposition (PECVD) process, wherein said deposited $TaN_x$ film contains less than about 2 at. % fluorine.

25. The method of claim 24 wherein said heating of said precursor is to a temperature of about 95° C.

26. A method of depositing a tantalum nitride ($TaN_x$) barrier film on a semiconductor device substrate having a temperature in the range of about 300° C.–500° C., the method comprising providing a vapor of a tantalum pentafluoride precursor to a reaction chamber containing said substrate by heating said precursor to a temperature sufficient to vaporize said precursor, then combining said vapor above said substrate with a process gas consisting essentially of nitrogen and hydrogen and optionally one or more of argon and helium by providing said process gas in said reaction chamber concurrently with providing said vapor to said reaction chamber to deposit said $TaN_x$ on said substrate by a thermal chemical vapor deposition (CVD) process, wherein said deposited $TaN_x$ film contains less than about 2 at. % fluorine.

27. The method of claim 26 wherein said heating of said precursor is to a temperature sufficient to provide a vapor pressure of said precursor of at least 3 Torr.

28. The method of claim 26 wherein said heating of said precursor is to a temperature of about 95° C.

29. The method of claim 26 wherein said delivery of said precursor is in the range of about 1–50 sccm.

30. The method of claim 26 wherein said process gas includes hydrogen gas at a flow of up to about 10 slm.

31. The method of claim 26 wherein said process gas is at a flow in the range of about 0.1–10 slm.

32. The method of claim 26 wherein said process gas is ammonia at a flow of 0.1–10 slm.

33. The method of claim 26 wherein said depositing occurs at a pressure of said chamber in the range of about 0.2–5.0 Torr.

34. The method of claim 26 wherein said film is integral with a copper layer of said substrate.

35. The method of claim 26 wherein said $TaN_x$ is deposited at a rate of at least about 100 Å/min.

36. The method of claim 26 wherein said substrate comprises an integrated circuit containing a high aspect ratio feature.

37. The method of claim 26 wherein said precursor is delivered to said reaction chamber without a carrier gas.

38. The method of claim 26 further comprising depositing said $TaN_x$ film sequentially with a tantalum film.

39. A method of depositing a tantalum nitride ($TaN_x$) barrier film on a semiconductor device substrate having a temperature in the range of about 300° C.–500° C., the method comprising delivering a tantalum pentafluoride precursor to a reaction chamber containing said substrate without a carrier gas by elevating a temperature of said precursor sufficient to produce a vapor of said precursor to provide a pressure of at least about 3 Torr to deliver said vapor of said precursor, combining said vapor above said substrate with a process gas consisting essentially of nitrogen and hydrogen by providing said process gas to said reaction chamber concurrently with providing said vapor to said reaction chamber, and depositing said tantalum nitride on said substrate by a thermal chemical vapor deposition process, wherein said deposited TaN$_x$ film contains less than about 2 at. % fluorine.

40. The method of claim 39 wherein said elevated temperature is in the range of about 83° C. to about 95° C.

41. The method of claim 39 wherein said elevated temperature is about 95° C.

42. The method of claim 39 wherein said elevated temperature is less than a temperature that would cause a reaction between said precursor vapor and said process gas.

43. The method of claim 39 wherein said pressure to deliver said vapor is at least about 5 Torr.

44. A method or depositing a tantalum (Ta) film on a semiconductor device substrate having a temperature in the range of about 300° C.–500° C., the method comprising providing a vapor of a tantalum pentafluoride precursor to a reaction chamber containing said substrate by heating said precursor to a temperature sufficient to vaporize said precursor, then combining said vapor in said reaction chamber with a process gas consisting essentially of hydrogen and optionally one or more of argon and helium and generating a plasma in said combined vapor and process gas and reacting said combined vapor and process gas in the presence of said plasma to deposit said Ta on said substrate by a plasma enhanced chemical vapor deposition (PECVD) process, wherein said deposited Ta film contains less than about 2 at. % fluorine.

45. The method of claim 44 wherein said heating of said precursor is to a temperature of about 95° C.

46. The method of claim 44 wherein said heating of said precursor is to a temperature sufficient to provide a vapor pressure of said precursor of at least 3 Torr.

47. The method of claim 44 wherein said delivery of said precursor is in the range of about 1–50 sccm.

48. The method of claim 44 wherein said process gas is hydrogen gas at a flow of about 1–10 slm.

49. The method of claim 44 wherein said depositing occurs at a pressure of said chamber in the range of about 0.2–5.0 Torr.

50. The method of claim 44 wherein said film is integral with a copper layer of said substrate.

51. The method of claim 44 wherein said Ta is deposited at a rate of at least about 100 Å/min.

52. The method of claim 44 wherein said substrate comprises an integrated circuit containing a high aspect ratio feature.

53. The method of claim 44 further comprising depositing said Ta film sequentially with a tantalum nitride film.

54. The method of claim 44 wherein said precursor is delivered to said reaction chamber without a carrier gas.

55. A method of depositing a tantalum (Ta) film on a semiconductor device substrate having a temperature in the range of about 300° C.–500° C., the method comprising delivering a tantalum pentafluoride precursor to a reaction chamber containing said substrate without a carrier gas by elevating a temperature of said precursor sufficient to produce a vapor of said precursor to provide a pressure of at least about 3 Torr to deliver said vapor of said precursor, then combining said vapor in said reaction chamber with a process gas consisting essentially of hydrogen and argon and generating a plasma in said combined vapor and process gas arid reacting said combined vapor and process gas in the presence of said plasma to deposit said Ta on said substrate by a plasma enhanced chemical vapor deposition (PECVD) process, wherein said deposited Ta film contains less than about 2 at. % fluorine.

56. The method of claim 55 wherein said elevated temperature is less than a temperature that would cause a reaction between said precursor vapor and said process gas.

57. The method of claim 55 wherein said pressure to deliver said vapor is at least about 5 Torr.

58. The method of claim 55 wherein said elevated temperature is in the range of about 83° C. to about 95° C.

59. The method of claim 55 wherein said elevated temperature is about 95° C.

60. A method of depositing a tantalum (Ta) barrier film and a tantalum nitride (TaN$_x$) barrier film on a semiconductor device substrate having a temperature in the range of about 300° C.–500° C., the method comprising depositing said Ta film by a plasma enhanced CVD process including providing a vapor of a tantalum pentafluoride precursor to a reaction chamber containing said substrate by heating said precursor to a temperature sufficient to vaporize said precursor and combining said vapor in said reaction chamber with a process gas consisting essentially of hydrogen and optionally one or more of argon and helium, and generating a plasma in said combined vapor and process gas and reacting said combined vapor and process gas in the presence of said plasma to deposit said Ta, and depositing said TaN$_x$ film by a CVD process selected from the group consisting of: (a) thermal CVD including combining said vapor above said substrate with a process gas consisting essentially of nitrogen and hydrogen and optionally one or more of argon and helium by providing said process gas to said reaction chamber concurrently with providing said vapor to said reaction chamber to deposit said TaN$_x$, and (b) plasma enhanced CVD including combining said vapor above said substrate with a process gas consisting essentially of N$_2$ and H$_2$ and optional inert gases to deposit said TaN$_x$, wherein said deposited Ta and TaN$_x$ films each contain less than about 2 at. % fluorine.

61. The method of claim 60 wherein said heating of said precursor is to a temperature of about 95° C.

62. The method of claim 60 wherein said heating of said precursor is to a temperature sufficient to provide a vapor pressure of said precursor of at least 3 Torr.

63. The method of claim 60 wherein said delivery of said precursor is in the range of about 1–50 sccm.

64. The method of claim 60 wherein said process gas to deposit said Ta is hydrogen gas at a flow in the range of about 1–10 slm.

65. The method of claim 60 wherein said process gas to deposit said TaN$_x$ is at a flow up to about 10 slm.

66. The method of claim 60 wherein said depositing occurs at a pressure of said chamber in the range of about 0.2–5.0 Torr.

67. The method of claim 60 wherein said film is integral with a copper layer of said substrate.

68. The method of claim 60 wherein said depositing occurs at a rate of at least about 100 Å/min.

69. The method of claim 60 wherein said substrate comprises an integrated circuit containing a high aspect ratio feature.

70. The method of claim 60 wherein said precursor is delivered to said reaction chamber without a carrier gas.

71. The method of claim 60 wherein said Ta film is deposited on said TaN$_x$ film.

72. The method of claim 60 wherein said TaN$_x$ film is deposited on said Ta film.

73. The method of claim 60 wherein at least the following films are deposited: a first Ta film is deposited on a substrate, a first TaN$_x$ film is deposited on said first Ta film, a second Ta film is deposited on said first TaN$_x$ film, and a second TaN$_x$ film is deposited on second Ta film.

74. The method of claim 60 wherein at least the following films are deposited: a first $TaN_x$ film is deposited on a substrate, a first Ta film is deposited on said first $TaN_x$ film, a second $TaN_x$ film is deposited on said first Ta film, and a second Ta film is deposited on second $TaN_x$ film.

75. The method of claim 60 wherein a plurality of Ta and $TaN_x$ film layers are deposited.

76. A method of depositing a Ta/$TaN_x$ bilayer barrier film on a semiconductor device substrate having a temperature in the range of about 300° C.–500° C., the method comprising delivering a tantalum pentafluoride precursor to a reaction chamber containing said substrate without a carrier gas by elevating a temperature of said precursor sufficient to produce a vapor of said precursor to provide a pressure of at least about 3 Torr to deliver said vapor of said precursor, depositing said Ta film by plasma enhanced CVD by combining said vapor in said reaction chamber with a first process gas consisting essentially of hydrogen and argon, and generating a plasma in said combined vapor and process gas and reacting said combined vapor and process gas in the presence of said plasma, and then depositing said $TaN_x$ film by a CVD process selected from the group consisting of; (a) thermal CVD by combining said vapor above said substrate with a second process gas consisting essentially of nitrogen and hydrogen by providing said second process gas to said reaction chamber concurrently with providing said vapor to said reaction chamber and (b) plasma enhanced CVD by combining said vapor above said substrate with a third process gas consisting essentially of $N_2$ and $H_2$, wherein said deposited Ta and $TaN_x$ films each contain less than about 2 at. % fluorine.

77. The method of claim 76 wherein said elevated temperature is about 95° C.

78. The method of claim 76 wherein said elevated temperature is in the range of about 83° C. to about 95° C.

79. The method of claim 76 wherein said elevated temperature is less than a temperature that would cause a reaction between said precursor vapor and said first and second and third process gas.

* * * * *

UNITED STATES PATENT AND TRADEMARK OFFICE
CERTIFICATE OF CORRECTION

PATENT NO. : 6,900,129 B2
APPLICATION NO. : 09/911913
DATED : May 31, 2005
INVENTOR(S) : Hautala et al.

It is certified that error appears in the above-identified patent and that said Letters Patent is hereby corrected as shown below:

Col. 2, line 21, "diethylamnio" should read --diethylamino--.
Col. 3, line 9, "directed to method" should read --directed to a method--.
Col. 3, line 57, "TaN film" should read --$TaN_x$ film--.
Col. 3, line 61, "$TaF_5$based film stack" should read --$TaF_5$ based film stack--.
Col. 6, line 40, "heating the a tantalum" should read --heating a tantalum--.
Col. 7, line 8, "contemplated as a being" should read --contemplated as being--.
Col. 7, line 26, "approximately 0.089 inches" should read --approximately 0.089 inch--.
Col. 9, line 46, "level of impurities are low" should read --level of impurities is low--.
Col. 11, line 45, "200 nm" should read --200 mm--.
Col. 12, line 4, "level of impurities are low" should read --level of impurities is low--.
Col. 12, line 19, "using TaCl, as the precursor" should read --using $TaCl_5$ as the precursor--.
Col. 14, line 52, "level of impurities are low" should read --level of impurities are low--.
Col. 15, line 6, "μΩM" should read --μΩcm--.
Col. 15, line 19, "FIG. 19 shows a" should read --FIG. 19 show a--.
Col. 16, line 60, "of impurities are low" should read --of impurities is low--.
Col. 19, line 32, "chemical deposition" should read --chemical vapor deposition--.
Col. 21, line 63, "arid reacting" should read --and reacting--.
Col. 22, line 34, "Ta and $TaN_x$, films" should read --Ta and $TaN_x$ films--.
Col. 22, line 67, "on second Ta film" should read --on said second Ta film--.
Col. 23, line 5, "on second $TaN_x$ film" should read --on said second $TaN_x$ film--.
Col. 24, line 1, "consisting of;" should read --consisting of:--.

Signed and Sealed this

Fifth Day of September, 2006

JON W. DUDAS
*Director of the United States Patent and Trademark Office*